(12) United States Patent
Meinhold et al.

(10) Patent No.: US 8,835,319 B2
(45) Date of Patent: Sep. 16, 2014

(54) PROTECTION LAYERS FOR CONDUCTIVE PADS AND METHODS OF FORMATION THEREOF

(75) Inventors: Dirk Meinhold, Dresden (DE); Norbert Mais, Nuremberg (DE); Reimund Engl, Munich (DE); Hans-Joerg Timme, Ottobrunn (DE); Alfred Vater, Dresden (DE); Stephan Henneck, Regensburg (DE); Norbert Urbansky, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 201 days.

(21) Appl. No.: 13/410,751

(22) Filed: Mar. 2, 2012

(65) Prior Publication Data

US 2013/0228929 A1    Sep. 5, 2013

(51) Int. Cl.
*H01L 23/488*    (2006.01)
*H01L 21/283*    (2006.01)

(52) U.S. Cl.
USPC ........................... 438/687; 257/762

(58) Field of Classification Search
CPC ............. H01L 23/53238; H01L 21/76843; H01L 2924/01079; H01L 2924/01013; H01L 2924/01029; H01L 2924/0105; H01L 2924/013; H01L 21/76877; H01L 21/76873
USPC .......................................... 257/762; 438/687
See application file for complete search history.

(56) References Cited

U.S. PATENT DOCUMENTS

| | | | |
|---|---|---|---|
| 4,566,026 A | 1/1986 | Lee et al. | |
| 5,453,401 A | 9/1995 | Grivna et al. | |
| 5,771,157 A | 6/1998 | Zak | |
| 6,183,880 B1 | 2/2001 | Yoshioka et al. | |
| 6,277,499 B1 | 8/2001 | Beers et al. | |
| 6,444,544 B1 | 9/2002 | Hu et al. | |
| 6,521,523 B2 | 2/2003 | Lee et al. | |
| 6,521,975 B1 * | 2/2003 | West et al. | 257/620 |
| 6,620,721 B1 * | 9/2003 | Lee | 438/612 |
| 7,329,607 B2 * | 2/2008 | Chopra et al. | 438/687 |
| 2003/0089979 A1 | 5/2003 | Malinowski et al. | |
| 2005/0098893 A1 * | 5/2005 | Tsutsue et al. | 257/758 |
| 2005/0136645 A1 * | 6/2005 | Cho | 438/624 |
| 2005/0224984 A1 | 10/2005 | Hortaleza et al. | |

OTHER PUBLICATIONS

English Translation of first page of JP 04-034939, Yoshikawa K., May 2, 1992.*
Greetham, G., "Phosphor Bronze: Teaching an Old Dog New Tricks," Copper Applications in Metallurgy of Copper & Copper Alloys, Jun. 2001, 8 pages, Copper.org.

* cited by examiner

*Primary Examiner* — Peniel M Gumedzoe
(74) *Attorney, Agent, or Firm* — Slater & Matsil, L.L.P.

(57) ABSTRACT

In one embodiment, a method of forming a semiconductor device includes forming a metal line over a substrate and depositing an alloying material layer over a top surface of the metal line. The method further includes forming a protective layer by combining the alloying material layer with the metal line.

34 Claims, 21 Drawing Sheets

PROTECTION LAYERS FOR CONDUCTIVE PADS AND METHODS OF FORMATION THEREOF

TECHNICAL FIELD

The present invention relates generally to conductive pads, and more particularly to protection layers for conductive pads and methods of formation thereof.

BACKGROUND

Semiconductor devices comprise many devices such as transistors that are interconnected using metal lines. Traditionally, interconnect metallization comprised aluminum lines. However, aluminum metal lines exhibit higher resistances and poorer reliability than equivalent copper metal lines especially when the metal lines are scaled. Consequently, copper metal lines have been introduced at lower levels of metal interconnect for continued scaling of integrated circuit technology. However, the uppermost lines are conventionally fabricated using aluminum due to the complexity of using an all copper process. For example, copper is easily degraded when exposed to environment. Similarly, contacts pads if made of copper can corrode and/or oxidize during post fabrication operations such as handling, storage, wafer-level parameter/functional test, data retention bakes, and other backend processing. Therefore, great care has to be taken if copper is used in upper levels of metallization to avoid environmental effects. Alternatively, copper may be avoided from the uppermost metal lines to avoid environmental degradation, but results in degraded electrical performance of the semiconductor device.

SUMMARY OF THE INVENTION

These and other problems are generally solved or circumvented, and technical advantages are generally achieved, by illustrative embodiments of the present invention.

In accordance with an embodiment of the present invention, a semiconductor device comprises a metal line comprising metal atoms disposed over a substrate. A portion of a top surface of the metal line has a contact area, for example, for attaching contact wires, or, to perform an electrical test. A protective layer comprising the metal atoms is disposed on the contact area. The protective layer is a different material from the metal line.

In accordance with an embodiment of the present invention, a method of forming a semiconductor device comprises forming a metal line over a substrate and depositing an alloying material layer over a top surface of the metal line. The method further includes forming a protective layer by combining the alloying material layer with the metal line.

In accordance with an embodiment of the present invention, a method of forming a semiconductor device comprises forming a metal line comprising a first metal over a substrate, and depositing an aluminum layer comprising a second metal over a top surface of the metal line. The method further includes annealing to form a protective layer comprising an alloy of the first and the second metals.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1C, illustrates a semiconductor device in accordance with various embodiments of the invention, wherein FIG. 1A illustrates a cross-sectional view of the semiconductor device and FIGS. 1B and 1C illustrate top views of the semiconductor device showing the uppermost metal lines.

FIG. 2, which includes FIGS. 2A-2C, illustrates a semiconductor device in accordance with various embodiments of the invention, wherein FIG. 2A illustrates a cross-sectional view of the semiconductor device and FIGS. 2B and 2C illustrate top views of the semiconductor device showing the uppermost metal lines.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention reduce environmental-, or, manufacturing-caused degradation of exposed copper regions in semiconductor devices.

For example, upper most metal lines may be exposed much longer than lower metal line to environmental effects because some of the back end processes may be performed at different manufacturing facilities. Similarly, other processes such as testing may require exposure of the uppermost metal lines. Furthermore, during assembly processes like chip singulation, wafer back grinding, die-attach and wire bonding, additional chemical, photo-chemical, or, thermal effects affect the exposed copper regions. In some cases, the upper most metal lines may continue to be exposed to environment during the life time of the product. Embodiments of the present invention overcome the problems associated with using copper in metal lines and pads that experience prolonged exposure to the environment.

One structural embodiment of the invention for protecting copper metal lines will be described using FIG. 1. Another structural embodiment of the invention for protecting copper metal lines will be described using FIG. 2. Various structural embodiments will be described using FIGS. 13, 15, 17, 20, and 21. A method of forming copper metal lines having a protective layer will be described using FIGS. 3-13. Alternative embodiments of forming copper metal lines with a protective layer will be described using FIGS. 14-15; 16-17; and 18-20.

Figure 1A:
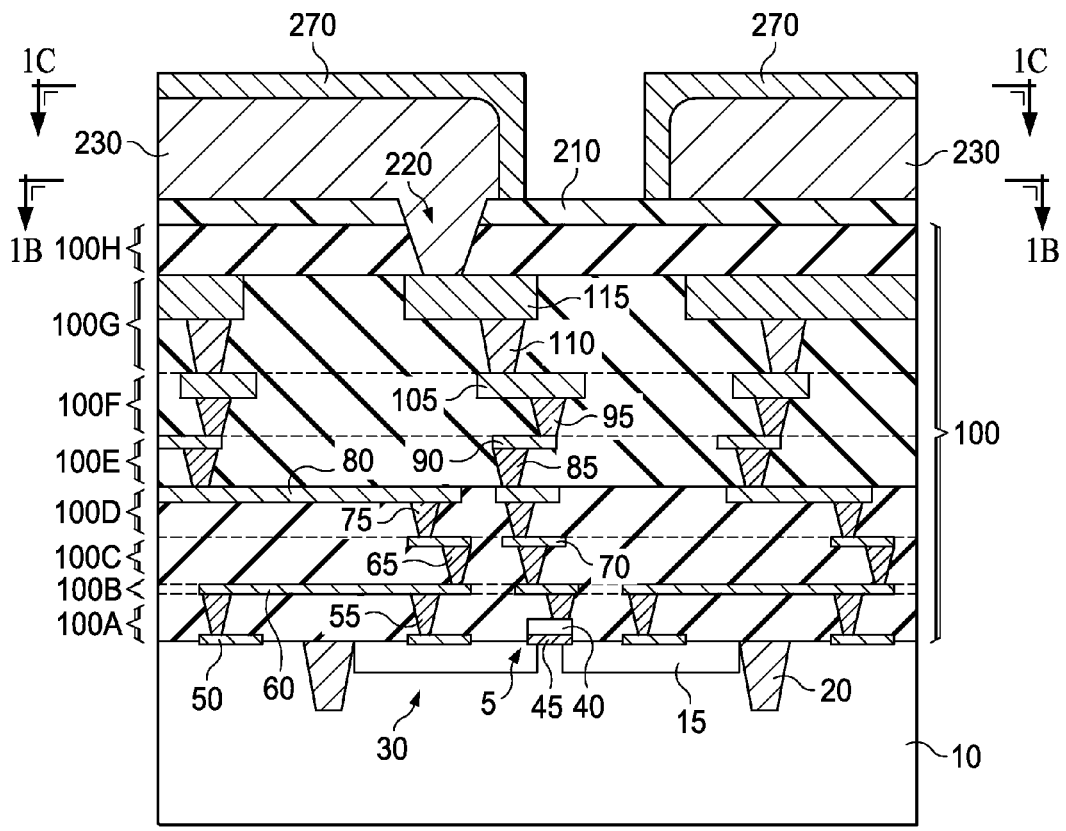
Figure 1B:
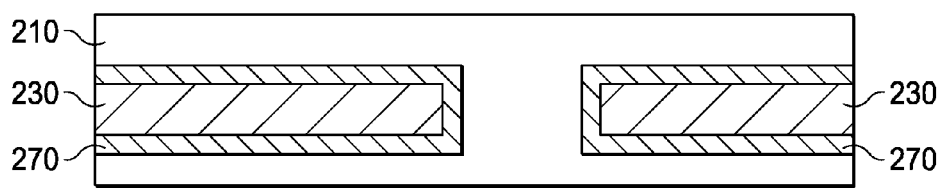
Figure 1C:
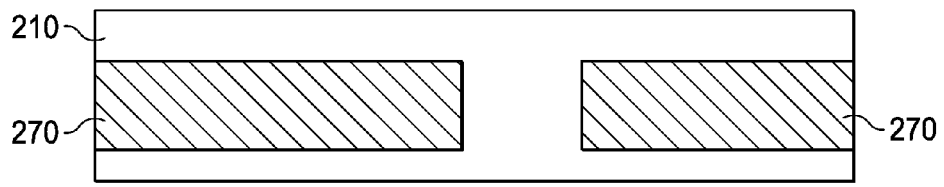

FIG. 1, which includes FIGS. 1A-1C, illustrates a semiconductor device in accordance with various embodiments of the invention, wherein FIG. 1A illustrates a cross-sectional view of the semiconductor device and FIGS. 1B and 1C illustrate top views of the semiconductor device showing the uppermost metal lines.

The substrate 10 may include many devices such as a transistor 5 illustrated in FIG. 1A. The transistor 5 comprises a gate 40, a gate dielectric 45, and a channel region 30 disposed between source/drain regions 15. Active areas that include transistors (e.g., CMOS transistors) may be separated from one another by isolation regions 20, e.g., shallow trench isolation. The source/drain regions 15 (and other device regions) are coupled to other devices on the substrate 10 and to input/output contacts through contact regions 50. The contact regions 50 may be disposed within the substrate 10 and may extend above the substrate 10 (as illustrated). In one or more embodiments, the contact regions 50 comprise silicide regions.

Metallization layers with metal lines and vias are disposed over the substrate 10 within an insulating layer 100. The number of metallization layers depends on the type of circuit and semiconductor device being fabricated. Only as an illustration seven metal layers are fabricated in this embodiment.

In various embodiments, the insulating layer 100 may comprise a plurality of layers. In one embodiment, each subsequent layer of metal line is formed within another insulating layer.

As an example, in the illustrated embodiment, the insulating layer 100 comprises a first insulating layer 100A, a second insulating layer 100B, a third fourth insulating layer 100C, a fourth insulating layer 100D, a fifth insulating layer 100E, a sixth insulating layer 100F, a seventh insulating layer 100G, and an eighth insulating layer 100H. Each of these layers of the insulating layer 100 may comprise a thickness of about 100 nm to about 500 nm, for example, although alternatively, they may comprise other dimensions. Each of these layers of the insulating layer 100 may be spin-on material or may have been deposited by vapor deposition techniques such as chemical vapor deposition, plasma vapor deposition.

Accordingly, a first insulating layer 100A covers the contact regions 50 and surrounds the gate 40. The transistor 5 may comprise additional structures such as offset spacers around the gate 40 and the gate dielectric 45. Contact plugs 55 are disposed within the first insulating layer 100A to couple with device regions in the substrate 10 through the contact regions 50.

Thus, first metal lines 60 are disposed within the second insulating layer 100B while first vias 65 and second metal lines 70 may be disposed within the third insulating layer 100C. A fourth insulating layer 100D is disposed over the third insulating layer 100C. Second vias 75 and third metal lines 80 may be disposed within the fourth insulating layer 100D.

A fifth insulating layer 100E is disposed over the fourth insulating layer 100D. Third vias 85 and fourth metal lines 90 may be disposed within the fifth insulating layer 100E. A sixth insulating layer 100F is disposed over the fifth insulating layer 100E. Fourth vias 95 and fifth metal lines 105 may be disposed within the sixth insulating layer 100F. A seventh insulating layer 100G is disposed over the sixth insulating layer 100F. Fifth vias 110 and sixth metal lines 115 may be disposed within the seventh insulating layer 100G. An eighth insulating layer 100H is disposed over the seventh insulating layer 100G.

In various embodiments, each layer of the insulating layer 100 comprises $SiO_2$ such as tetra ethyl oxysilane (TEOS) or fluorinated TEOS (FTEOS) in one or more embodiments. In various embodiments, the insulating layer 100 may comprise insulating materials typically used in semiconductor manufacturing for inter-level dielectric (ILD) layers such as doped glass (BPSG, PSG, BSG), organo silicate glass (OSG), carbon doped oxides (CDO), fluorinated silicate glass (FSG), spin-on glass (SOG), or low-k insulating materials, e.g., having a dielectric constant of about 4 or less. The insulating layer 100 may also comprise dielectrics having a dielectric constant of about 3 or lower such as dense SiCOH or porous dielectrics, as examples.

As illustrated in FIG. 1A, in one or more embodiments, the thickness of the metal lines and the vias may increase moving up from lower level metallization to the upper level metallization. Thus, in the illustrated example, six metal levels are stacked vertically and connected by contact and via levels. In other embodiments, more or less number of metal levels and via levels may be used.

An etch stop layer 210 covers the eighth insulating layer 100H. Top metal lines 230 are formed over the etch stop layer 210 and form the uppermost metal lines for the semiconductor device. Therefore, the top metal lines 230 have large contact structures, for example, for forming external contacts.

FIG. 1 illustrates one particular embodiment with vias 220 and metal lines 230 manufactured in a through-resist-plating integration scheme. An alternative embodiment is presented in FIG. 2, where the fabrication of vias 220 and metal lines 239 is accomplished using a dual-damascene integration scheme.

In various embodiments, a protective conductive layer 270 is disposed on the top metal lines 230. The protective conductive layer 270 prevents the corrosion of the top metal lines 230 during subsequent processing and/or during the life time use of the product. Without the protective conductive layer 270, the top metal lines 230 may degrade when exposed to the outside environment. For example, the top metal lines 230 may comprise copper, which unlike aluminum, does not form a protective native oxide. Therefore, top metal lines 230 formed in a copper process can degrade over time. Embodiments of this invention prevent degradation of the top metal lines 230 by forming a protective conductive layer 270.

Advantageously, the protective conductive layer 270 reduces the corrosion of the underlying top metal lines to atmosphere as well as to water (for example, sea water). The protective conductive layer 270 improves resistance of the top metal lines 230 to oxidation at high temperatures, and may also protect from different environments such as from sulfurous compounds etc.

Figure 13:
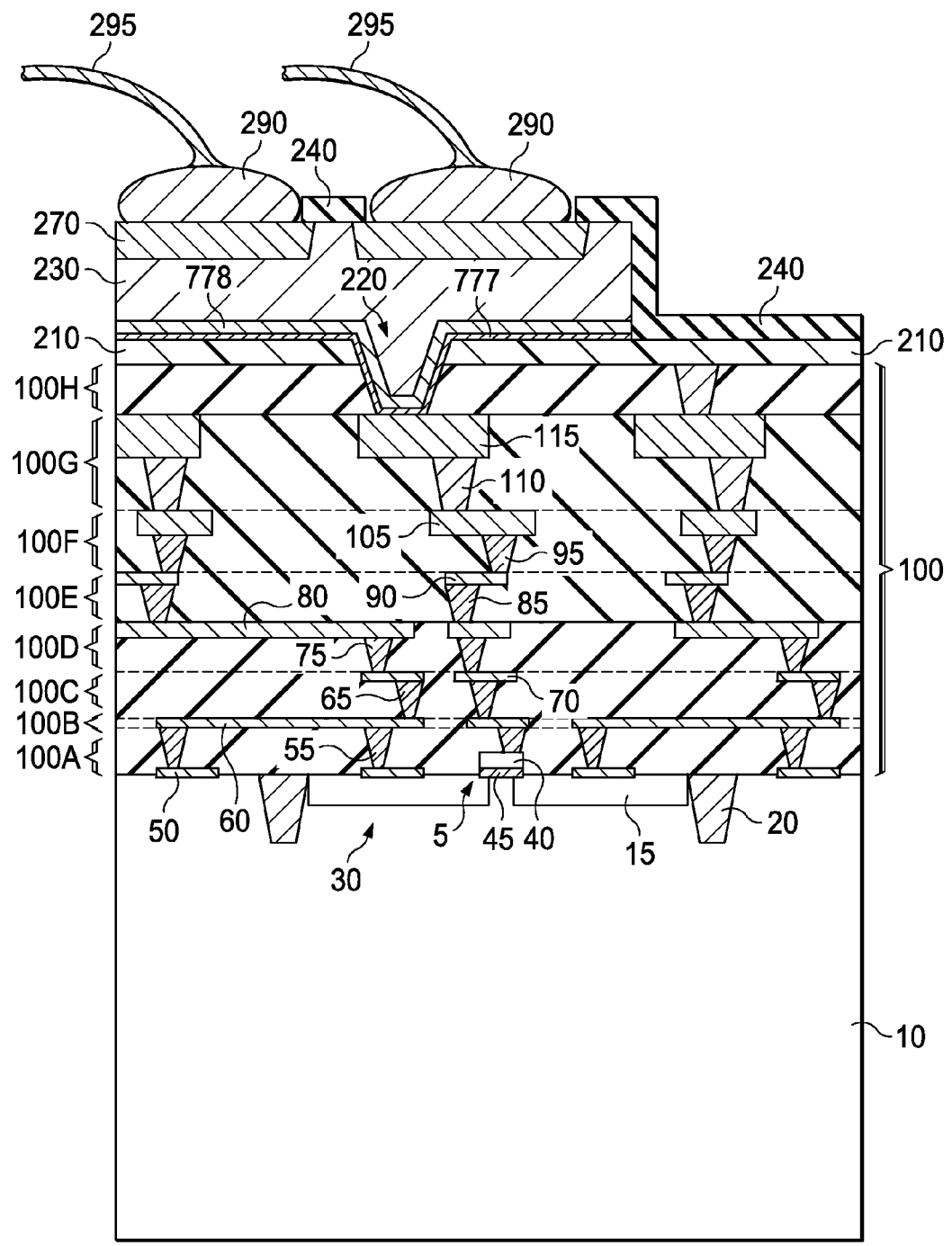

In one or more embodiments, the protective conductive layer 270 has a thickness of about 40 nm to about 100 nm, and about 70 nm to about 80 nm in one embodiment. In one or more embodiments, the protective conductive layer 270 has a thickness of about 40 nm to about 50 nm. In various embodiments, the protective conductive layer 270 is conformal with the underlying top metal lines 230. While the protective conductive layer 270 has been illustrated in the embodiment described by FIG. 1 as uniformly covering the top surface of the metal line 230, in some embodiments, as described by FIG. 2, the protective conductive layer 270 may cover only portions of the top surface of metal line 230, while other portions of the metal line 230 are covered by a dielectric passivation layer 240. In a further example, as illustrated in FIG. 13, in some embodiments, the protective conductive layer 270 may be formed within recesses in the dielectric passivation layer 240 within the top metal lines 230.

Embodiments of the invention include forming the protective conductive layer 270 using alloys comprising Cu—Al, Cu—Ni, Cu—Cr, Cu—Sn, Cu—Sn—P, Cu—Zn, Cu—Zn—Si, Cu—Mg, and combinations thereof.

In various embodiments, the protective conductive layer 270 comprises aluminum and copper. In one or more embodiments, the protective conductive layer 270 comprises an alloy of aluminum and copper such as aluminum bronze. In one embodiment, the protective conductive layer 270 comprises an alloy of aluminum and copper having less than about 30% aluminum. In one embodiment, the protective conductive layer 270 comprises an alloy of aluminum and copper having about 8% to about 20% aluminum.

Alloying with tin may improve the corrosion resistance of copper, and therefore, in various embodiments, the protective conductive layer 270 comprises an alloy of copper and tin. Embodiments of the invention include up to about 15.8% tin because, at such low concentrations, the tin is dissolved within the solid solution of copper. In one embodiment, the protective conductive layer 270 comprises about 88% to about 90% copper and about 10% to about 12% tin.

In an alternative embodiment, the protective conductive layer 270 comprises a phosphor bronze. For example, the protective conductive layer 270 may comprise an alloy of copper with about 3.5% to about 10% of tin and about 0.5% to about 2% phosphorus. In other embodiments, the protective conductive layer 270 comprises between about 0.5% and 11% tin and about 0.01% to about 0.35% phosphorous.

In alternative embodiments, the protective conductive layer 270 comprises a chromium copper alloy comprising about 0.6% to about 1.2% Cr. In another embodiment, the protective conductive layer 270 comprises a copper zinc alloy comprising up to 35% zinc. In another embodiment, the protective conductive layer 270 comprises silicon brasses having less than about 20% zinc and less than about 6% silicon, for example, having copper about 80.0% to about 83.0%, silicon about 3.4% to about 5.4%, and zinc about 12.0% to about 13.0%.

In another embodiment, the protective conductive layer 270 comprises copper nickel alloys, for example, having about 85% to about 87% copper and about 8% to about 11% nickel. In an alternative embodiment, the protective conductive layer 270 comprises copper magnesium alloys.

In various embodiments, the protective conductive layer 270 may comprise other alloying agents such as iron, tin, nickel, manganese, and silicon along with aluminum and copper. Examples of the materials used as the protective conductive layer 270 may also include $CuAl_5$, $CuAl_8$, $CuAl_{11}$, $CuAl_8Fe_3$, $CuAl_9Mn_2$, $CuAl_{10}Fe_3$, and $CuAl_{10}Fe_5Ni_5$, where the alloy compositions are indicated according to the proportional composition by weight of each alloying element except copper, which is the remainder. In some embodiments, the protective conductive layer 270 comprises copper, aluminum and tin.

As illustrated in FIGS. 1A and 1B, the protective conductive layer 270 may be formed along the sidewalls of the top metal lines 230. Therefore, embodiments of the invention prevent degradation of the top metal lines 230 from the sides.

Figure 2A:
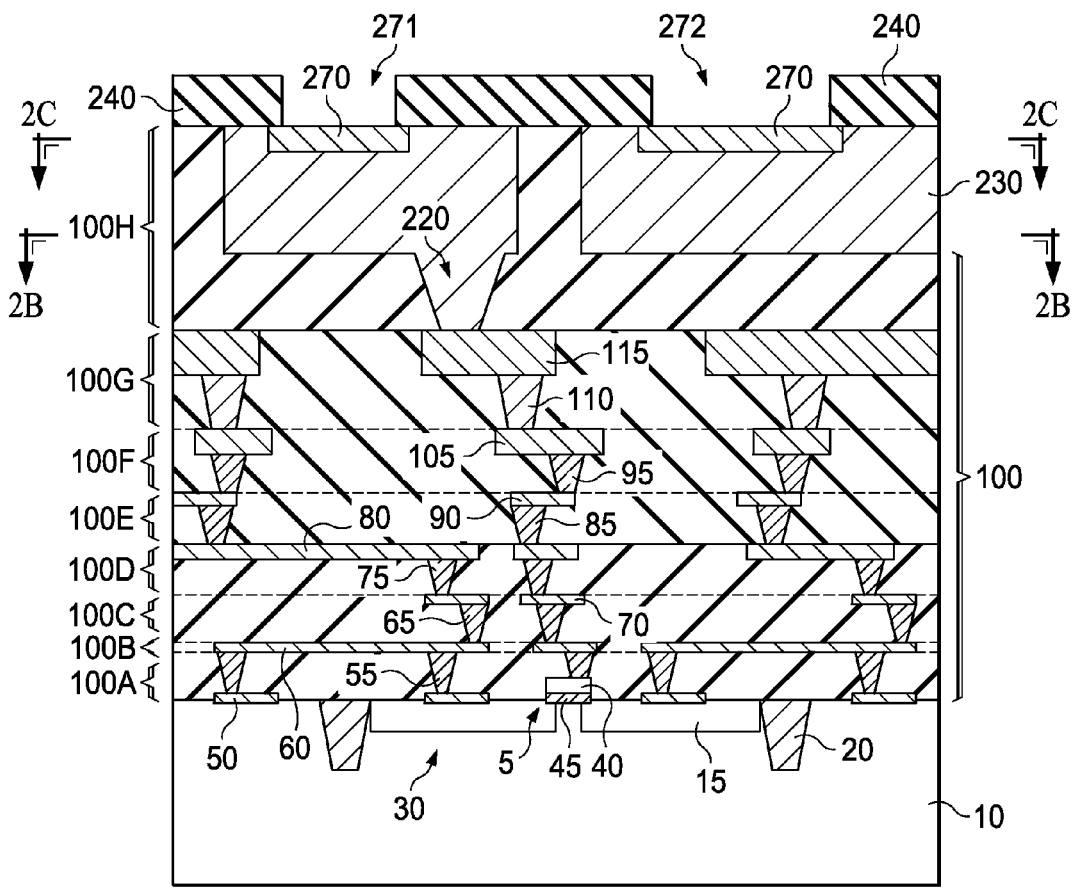
Figure 2B:
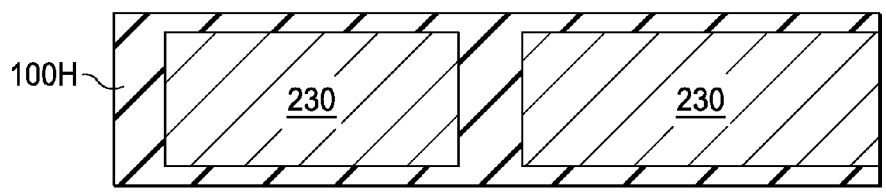
Figure 2C:
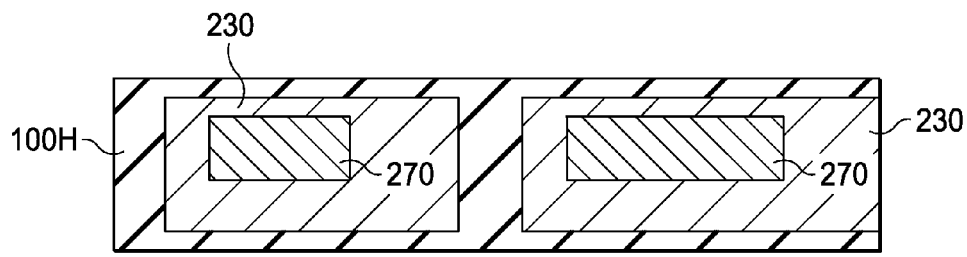

Referring to FIG. 2A, the upper most metal lines, i.e., top metal lines 230 have a first landing pad 271 and a second landing pad 272 exposing the conductive protection layer 270, for example, for forming a contact pad to couple the semiconductor device with external power and data sources.

FIGS. 3-13 illustrate a method of forming a semiconductor device having metal lines covered with a protective layer in accordance with embodiments of the invention.

Figure 3A:
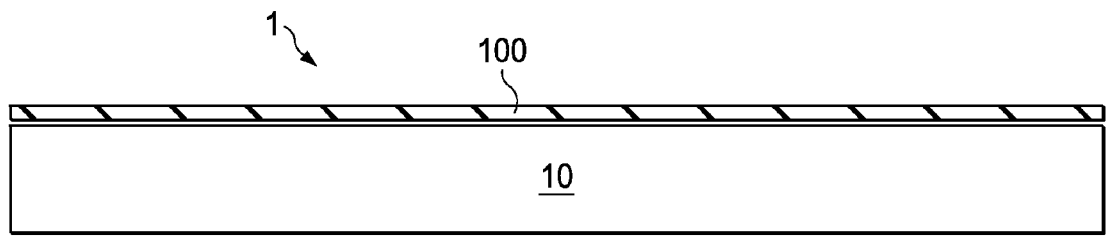
FIGS. 3-13 illustrate a method of forming a semiconductor device having metal lines covered with a protective layer in accordance with embodiments of the invention.
Figure 3B:
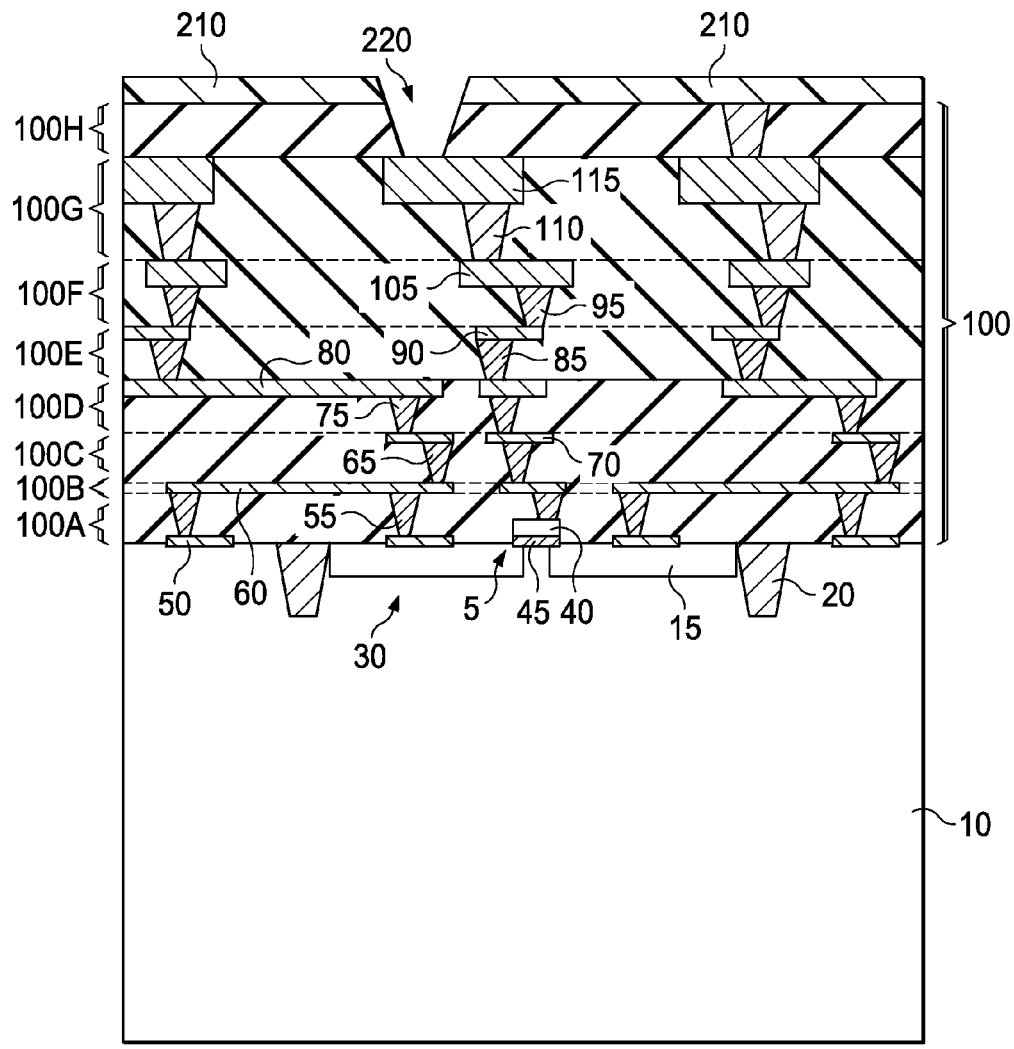

FIG. 3, which includes FIGS. 3A and 3B illustrates a semiconductor substrate 10 during back end of line processing after the completion of front end of line processing, wherein FIG. 3B illustrates a magnified cross-sectional view of FIG. 3A. FIG. 3B also illustrates the semiconductor device, which (not shown to scale) contains active circuitry disposed inside it. The active circuitry contains the device regions and includes necessary transistors, resistors, capacitors, inductors or other components used to form integrated circuits.

As illustrated in FIG. 3A, after forming the device regions in/over a substrate 10, metallization layers are formed in an insulating layer 100 over the device regions to electrically contact and interconnect the active devices. The metallization layers and device regions together form a complete functional integrated circuit. In other words, the electrical functions of the semiconductor device can be performed by the interconnected active circuitry. In logic devices, the metallization may include many layers, e.g., nine or more, of copper or alternatively of other metals. In memory devices, such as DRAMs, the number of metal levels may be less.

Thus, after front and back end processing, the semiconductor substrate 10 has a plurality of semiconductor devices, i.e., chips 1, formed within. The chips 1 may be any type of chip. For example, the chips 1 may be a logic chip, a memory chip, an analog chip, and other types of chips. Each semiconductor device may comprise a plurality of devices such as transistors or diodes forming an integrated circuit or may be a discrete device such as a single transistor or a single diode.

Referring to FIG. 3B, isolation regions 20 may be formed within a substrate 10 using, for example, a shallow trench isolation process. In one embodiment, the substrate 10 may comprise a semiconductor wafer such as a silicon wafer. In other embodiments, the substrate 10 may comprise other semiconductor materials including alloys such as SiGe, SiC or compound semiconductor materials such as GaAs, InP, InAs, GaN, sapphire, silicon on insulation, for example.

Next, device regions are formed within the substrate 10. The device regions may include a transistor 5 in various embodiments. In other embodiments, the device regions may include bipolar devices, diodes, thyristors, varactors, etc. as well as passive devices such as resistors, inductors etc.

The regions of the transistor 5 are formed within/above the substrate 10. A layer of a gate dielectric is deposited followed by the deposition of a layer of gate. The layers of gate dielectric and gate are patterned forming a gate 40 and a gate dielectric 45. A channel region 30 is formed within the substrate 10 under the gate 40. Source/drain regions 15 are formed, for example, by ion-implantation and/or epitaxy.

In various embodiments, all necessary interconnects, connections, pads etc. for coupling between devices and/or with external circuitry are formed over the substrate 10. Accordingly, a metallization layer is formed over the substrate 10. The metallization layer may comprise one or more levels of metallization. Each level of metallization may comprise metal lines or vias embedded within a layer of an insulating layer 100. The metal lines and vias establish contact to the device regions and also to couple different devices within each chip.

Contact regions 50 are formed, for example, by siliciding a top surface of the source/drain regions 15. Therefore, the contact regions 50 may be formed within the substrate 10 but may extend above the top surface of the substrate 10. A first insulating layer 100A is deposited over the contact regions 50 and planarized. Contact plugs 55 are formed within the first insulating layer 100A to couple with device regions in the substrate 10 through the contact regions 50.

A second insulating layer 100B is deposited over the first insulating layer 100A. First metal lines 60 are formed within the second insulating layer 100B. A third insulating layer 100C is deposited over the second insulating layer 100B. First vias 65 and second metal lines 70 are formed within the third insulating layer 100C. A fourth insulating layer 100D is deposited over the third insulating layer 100C. Second vias 75 and third metal lines 80 are formed within the fourth insulating layer 100D. A fifth insulating layer 100E is deposited over the fourth insulating layer 100D. Third vias 85 and fourth metal lines 90 are formed within the fifth insulating layer 100E. A sixth insulating layer 100F is deposited over the fifth insulating layer 100E. Fourth vias 95 and fifth metal lines 105 are formed within the sixth insulating layer 100F. A seventh insulating layer 100G is deposited over the sixth insulating layer 100F. Fifth vias 110 and sixth metal lines 115 are formed within the seventh insulating layer 100G. An eighth insulating layer 100H is deposited over the seventh insulating layer 100G. An etch stop liner 210 may be deposited over the seventh insulating layer 100G.

In various embodiments of the invention, the metal and via levels are formed using a single damascene process or a dual damascene process. In a single damascene process, a single layer of insulating material is patterned with a pattern for conductive features, such as conductive lines, conductive vias. In contrast, in a dual damascene process, the vias and metals lines are patterned for conductive features and filled in a single fill step with a conductive material.

The description follows a dual damascene process only as an example. A first hard mask layer (not shown) is deposited over the eighth insulating layer 100H. The first hard mask layer comprises SiO$_2$ such as tetra ethyl oxysilane (TEOS), silicon carbide (SiC) or carbon doped glass, but in various embodiments other materials may be used. An etch stop liner 210 may also be deposited prior to depositing the first hard mask. Using conventional lithography techniques, the first hard mask layer is patterned for vias. Using the first hard mask layer as an etch mask, a plurality of holes for forming sixth vias 220 (FIG. 1A) is patterned within the eighth insulating layer 100H, i.e., the pattern from the first hard mask layer is transferred to the eighth insulating layer 100H. In various embodiments, the plurality of holes may be formed using an anisotropic etch process, such as reactive ion etch.

In the following embodiment described in FIG. 4, the formation of the last metal line is accomplished by a through-resist plating process. First, a metal liner 777 and a seed liner 778 are deposited by a physical-vapor deposition process or a chemical vapor deposition process onto the etch stop layer 210 and in the via hole openings 220. The metal liner 777 may comprise titanium, titanium nitride, tantalum, tantalum nitride, titanium tungsten and other suitable materials that prevent diffusion of copper into the seventh or eighth insulating layers 100G/100H. The seed liner 778 is made of copper in one embodiment. The seed liner 778 may contain dopants like aluminum, titanium, or, manganese.

Figure 5:
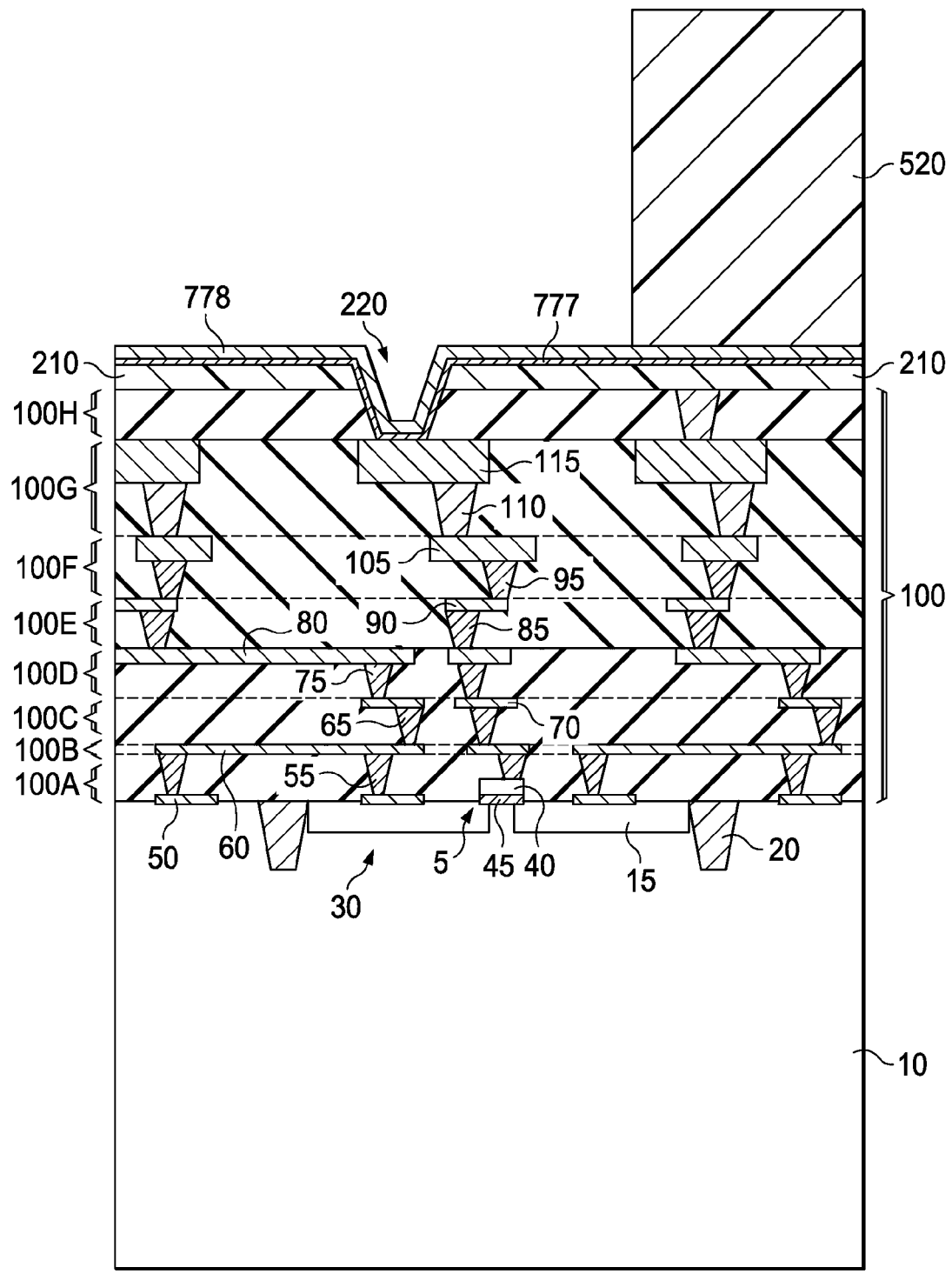

As illustrated in FIG. 5, in one or more embodiments, a first resist layer 520 is deposited and patterned to form pattern for top metal lines 230. The first resist layer 520 may comprise a photo resist material in one embodiment.

Figure 6:
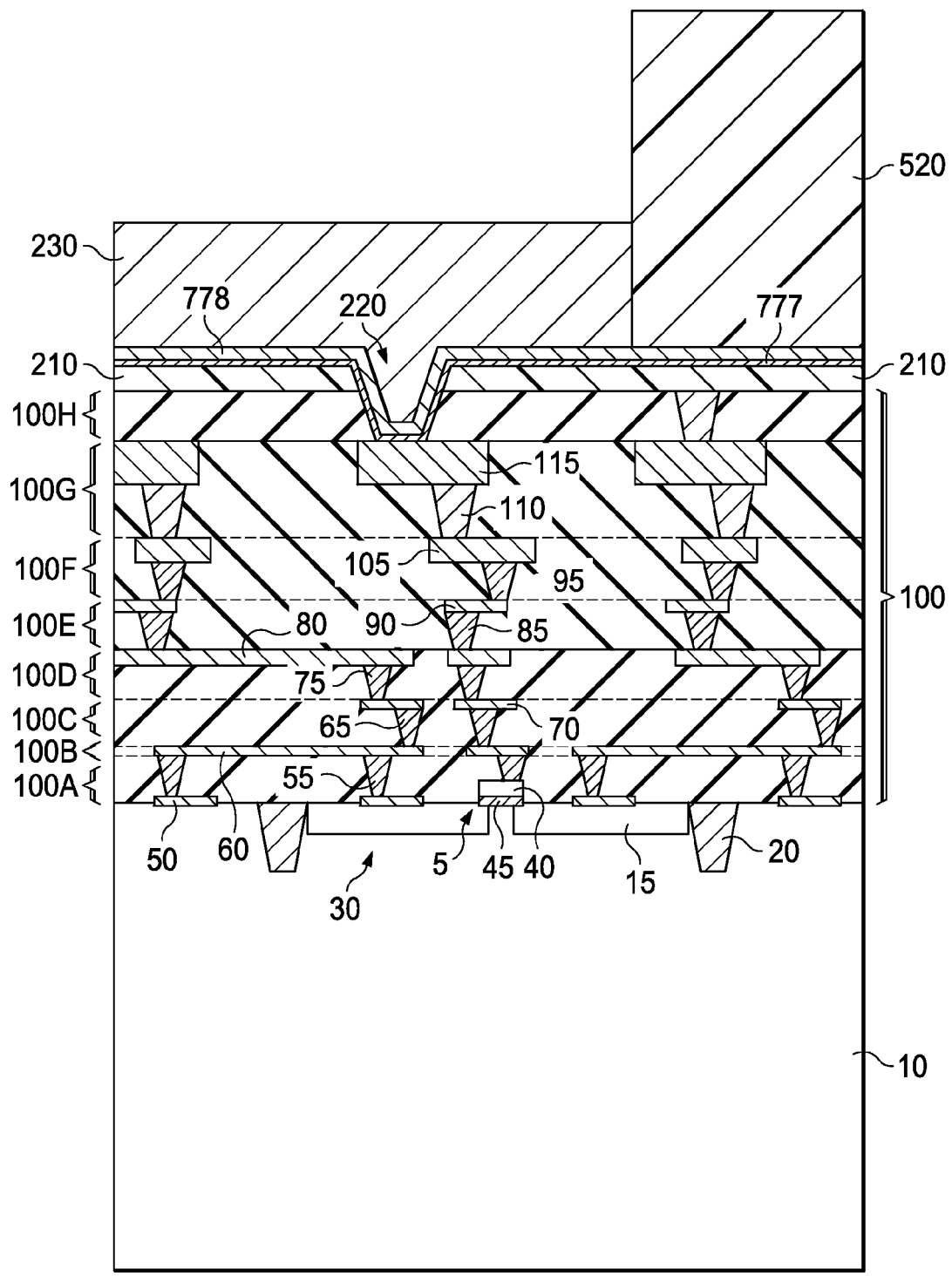

Referring to FIG. 6, a copper layer is deposited within the pattern for vias and pattern for metal lines thereby forming sixth vias 220 and top metal lines 230. In various embodiments, copper is filled into the pattern for metal lines and the pattern for vias using an electro-chemical deposition process. In one embodiment, the copper comprises pure metallic copper. Copper may include impurities as well as other additive metals in various embodiments. In an alternative embodiment, the copper comprises an alloy of copper.

Figure 7:
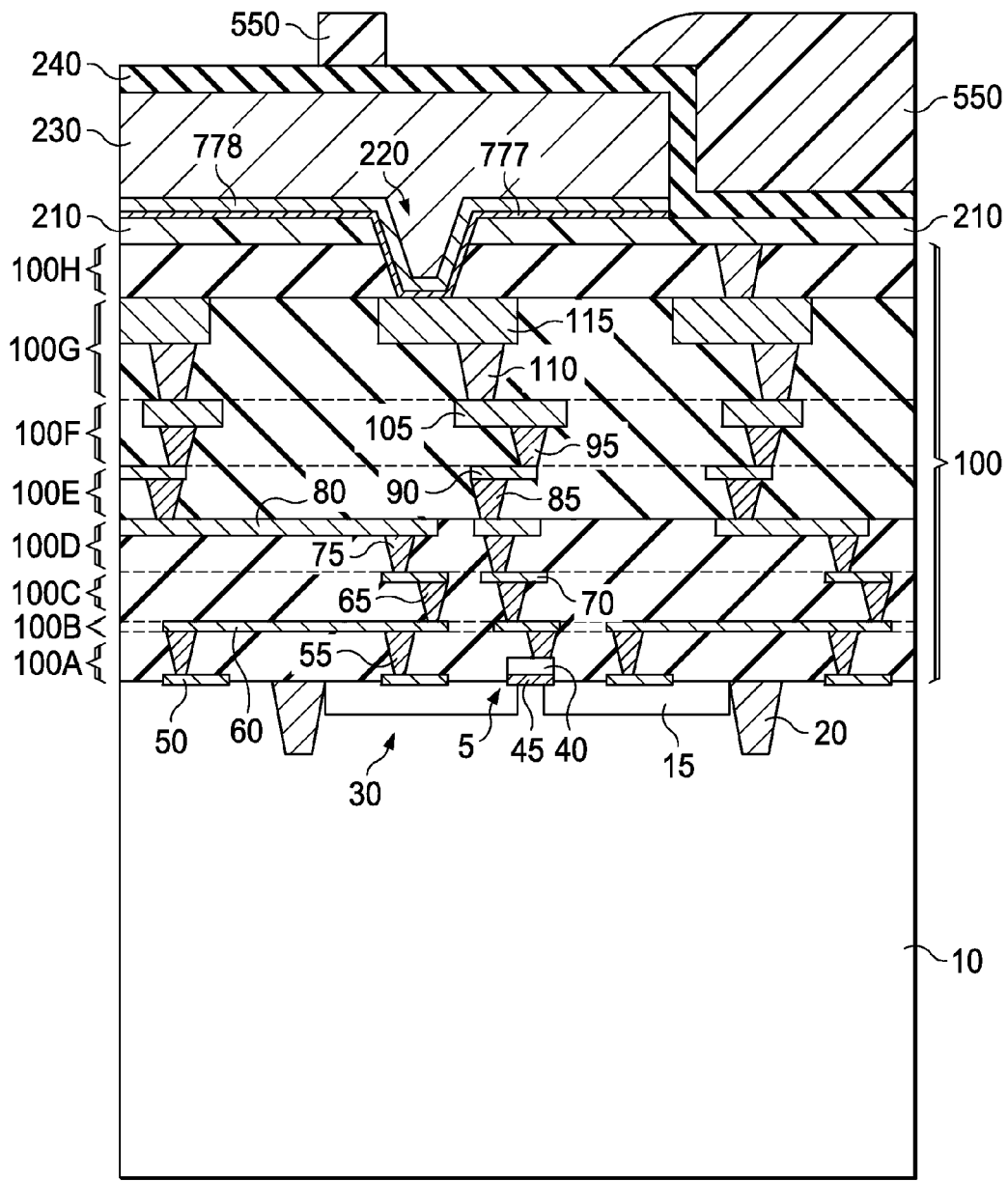
Figure 8:
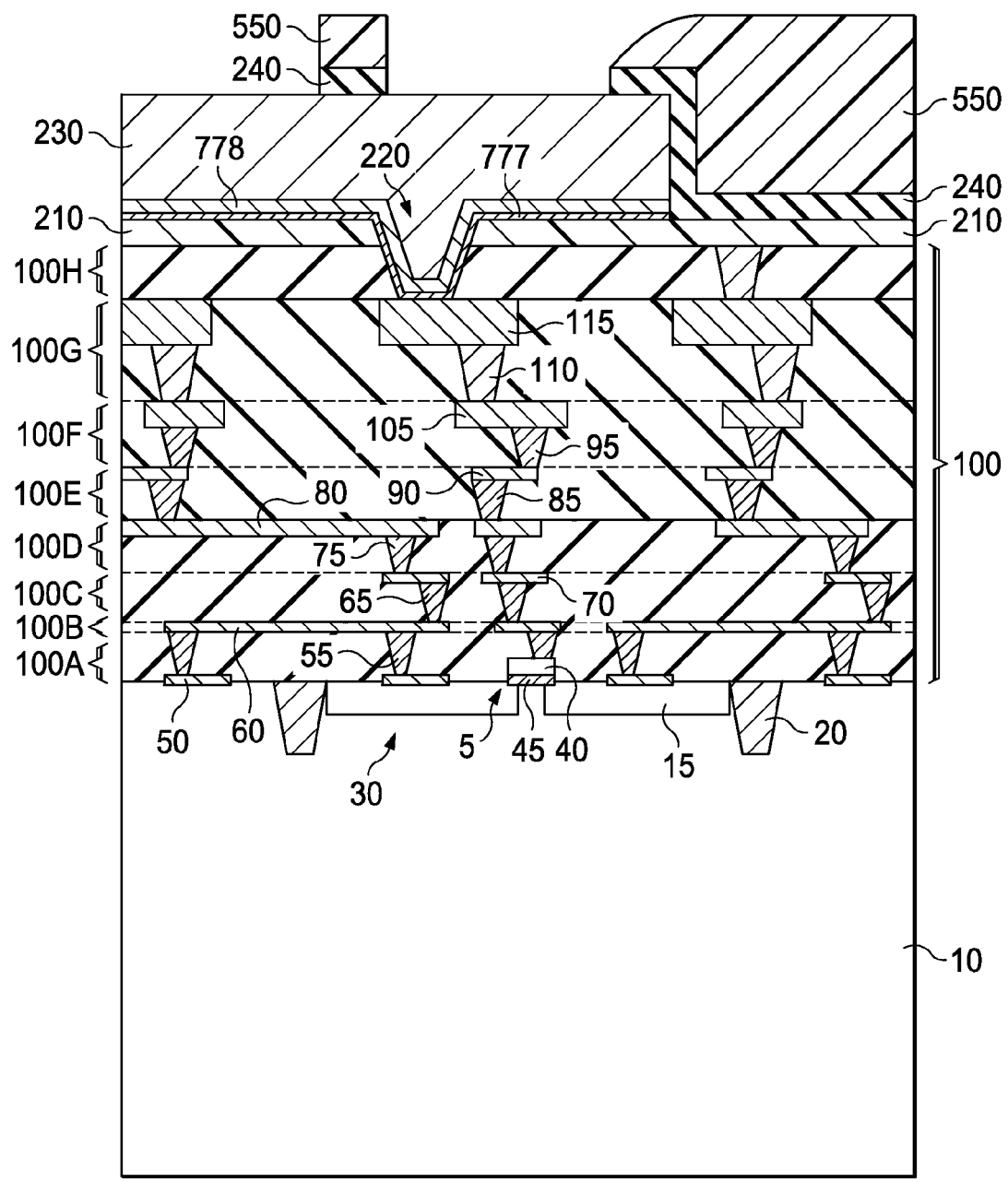

Referring to FIG. 7, the resist layer 520 is removed. In a next step, the metal liner 777 and a seed liner 778 are removed at areas that were covered by the resist 520 during electro-chemical deposition of lines 230 and vias 220.

A protective liner 240 is deposited over the top metal lines 230. In various embodiments, the protective liner 240 comprises a passivation layer. In various embodiments, the protective liner 240 may comprise an oxide such as silicon dioxide, a nitride such as silicon nitride, or a combination thereof.

After depositing the protective liner 240, a second resist layer 550 is deposited and patterned. In various embodiments, the second resist layer 550 forms part of a mold body of a package comprising the semiconductor device. The second resist layer 550 covers regions of the top metal lines 230 over which no contact is to be made. In other words, the second resist layer 550 does not cover the regions of the top metal lines 230 over which contact pads are to be formed. In one embodiment, the second resist layer 550 comprises a mold compound such as an imide layer although in various embodiments, the second resist layer 550 may comprise other materials including photo resist materials.

As next illustrated in FIG. 7, the exposed portion of the protective liner 240 is removed to expose the surface of the top metal lines 230. The protective liner 240 may be removed using an etching process such as a wet etch or a reactive ion etch in various embodiments.

Figure 9:
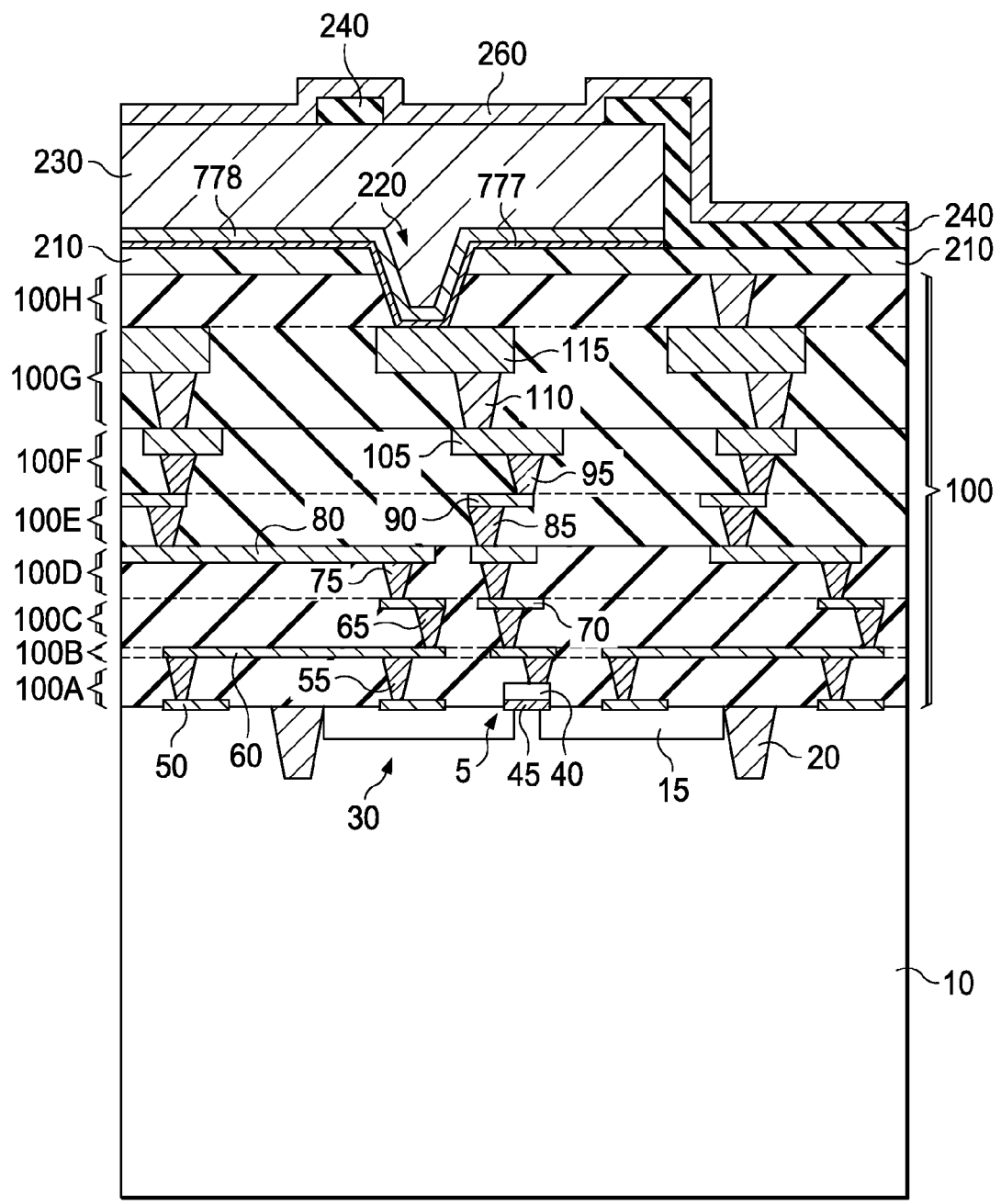

Referring to FIG. 9, the second resist layer 550 is removed after completion of the etch process and the alloying layer 260 is deposited over the top metal lines 230 and the patterned passivation layer 240. In various embodiments, the alloying layer 260 comprises aluminum. In another embodiment, the alloying layer 260 comprises aluminum doped with copper, for example, less than about 2% copper. In one embodiment, the alloying layer 260 comprises pure aluminum, for example, more than 99% aluminum. In some embodiments, the alloying layer 260 comprises aluminum along with other alloying materials such as tin, iron, manganese. In another embodiment, the alloying layer 260 is a layer of nickel or a layer of tin.

In various embodiments, the alloying layer 260 is deposited as a conformal layer. In various embodiments, the alloying layer 260 is deposited using sputter deposition. In other embodiments, other suitable techniques may be used to deposit the alloying layer 260. For example, other vapor deposition techniques may be used to form the alloying layer 260. In various embodiments, the alloying layer 260 has a thickness of about 5 nm to about 50 nm, and about 10 nm to about 20 nm in one embodiment. In various embodiments, the alloying layer 260 has a thickness of about 5% to about 25% of the total thickness of the top metal lines 230.

In other embodiments the second resist layer 550 is not removed prior to the deposition of the alloying layer 260.

As illustrated next in FIG. 10, a protective conductive layer 270 is formed over a top portion of the top metal lines 230. In various embodiments, thermal energy is provided to enable reaction or inter-diffusion between the alloying layer 260 and the top metal lines 230.

In one or more embodiments, the alloying layer 260 is heated globally by annealing the substrate 10. In one or more embodiments, the alloying layer 260 is annealed at a temperature of about 350° C. to about 400° C. In one or more embodiments, the alloying layer 260 is annealed at a temperature of at least 250° C., and at least 300° C. in another embodiment. In one or more embodiments, the alloying layer 260 is annealed at a temperature of at least 350° C. In one or more embodiments, the alloying layer 260 is annealed at a temperature less than about 300° C., and less than about 400° C. in another embodiment. In one or more embodiments, the alloying layer 260 is annealed at a temperature of at least 500° C. In one or more embodiments, the alloying layer 260 is annealed at a temperature of at least 550° C. In one embodiment, the alloying layer 260 may be annealed at a temperature of about 350° C., 380° C., or 400° C. In one embodiment, the alloying layer 260 may be annealed using a rapid thermal anneal process. In one embodiment, the alloying layer 260 may be annealed using a process having a stabilization temperature followed by a rapid ramp up to peak temperature (which may be the temperature described above), a hold for less than about 10 s (or less than about 1s in one embodiment) and then ramp down. In one embodiment, when the patterned second resist layer 550 comprises a photo imide that has not been removed prior to the deposition of the alloying layer 260, the anneal temperature is chosen so as to be lower than the cure temperature of the patterned second resist layer 550 to avoid out-gassing of the imide.

In another embodiment, the alloying layer 260 is locally heated, for example, by scanning an electromagnetic wave over the alloying layer 260. In one embodiment, a laser pulse may be scanned so as to heat the alloying layer 260.

Due to the thermal energy, the atoms from the alloying layer 260 diffuse into the underlying top metal lines 230. Similarly, copper atoms from the top metal lines 230 diffuse into the alloying layer 260. Thus, a protective conductive layer 270 is formed over a top portion of the top metal lines 230. The protective conductive layer 270 is a region or zone over which both copper atoms from the top metal lines 230 and atoms from the alloying layer 260 co-exist. In one or more embodiments, the protective conductive layer 270 has the same phase or crystal structure as the underlying top metal lines 230. Therefore, in various embodiments, the protective conductive layer 270 has the same phase as copper in the top metal lines 230.

However, in some embodiments, the protective conductive layer 270 may comprise a different phase from the top metal lines 230. Further, in some embodiments, a compound having a distinctive stoichiometric composition may be formed instead of an alloy. Embodiments of the invention also include compounds dispersed within a solid solution.

In various embodiments, the thickness of the protective conductive layer 270 is governed by the thickness of the alloying layer 260, the temperature of anneal, and the material of the alloying layer 260 and the top metal lines 230. When an aluminum layer having a thickness of about 5 nm is deposited over a copper metal line, and annealed at about 350° C. to about 400° C., an aluminum bronze layer having a thickness of about 30 nm is formed. Similarly, when a 50 nm of aluminum layer is deposited over a copper metal line, and annealed at about 350° C. to about 400° C., a 300 nm aluminum bronze layer is formed.

Figure 10:
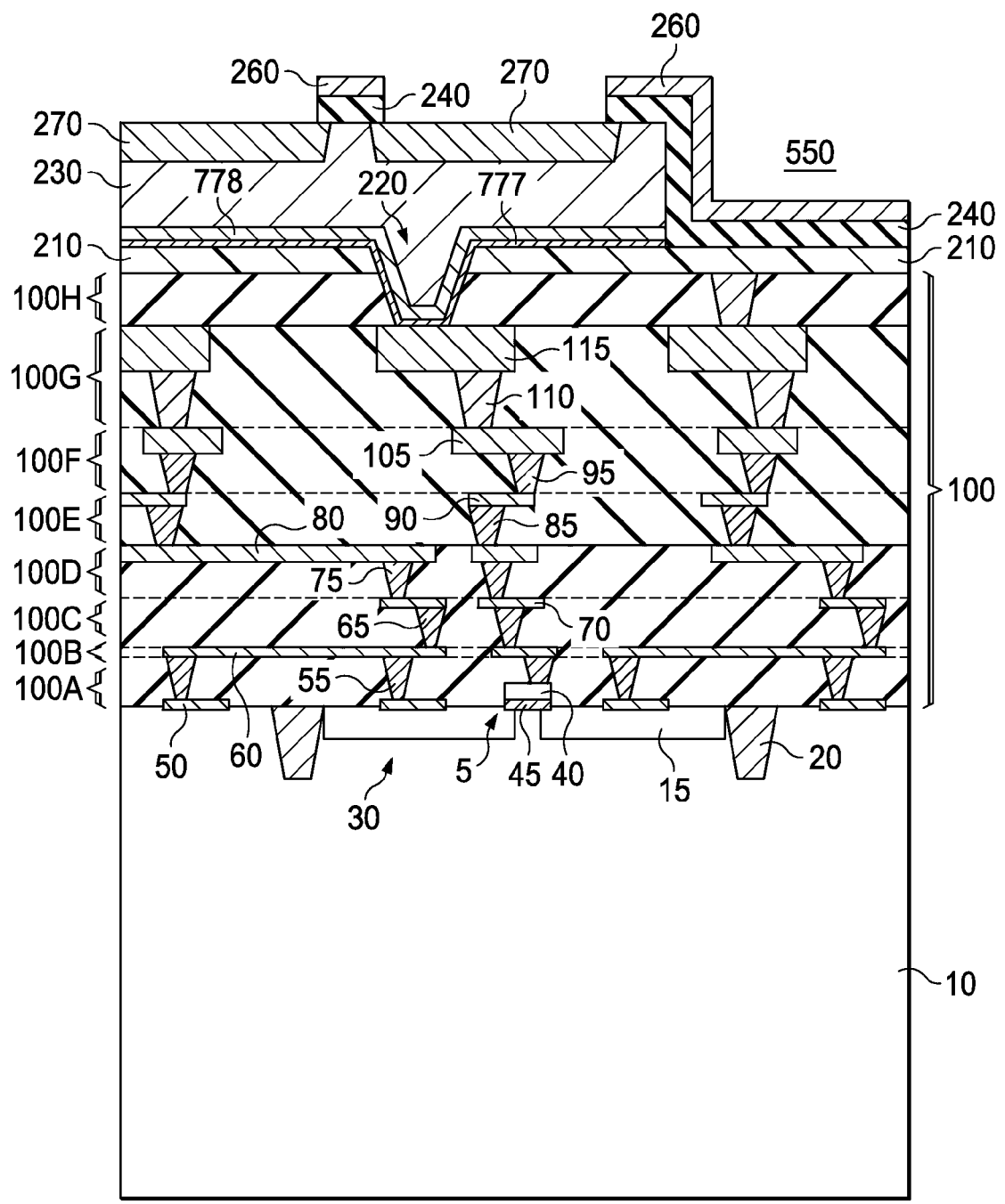

In the illustrated embodiment of FIG. 10 all of the alloying layer 260 over the top surface metal lines 270 is consumed. The alloying layer 260 is still present on the dielectric passivation layer 240. However, in some embodiments, the annealing may be timed so that only a portion of the alloying layer 260 forms the protective conductive layer 270. Thus, after the reaction or inter-diffusion between the top metal lines 230 and the alloying layer 260, some portion of the unused alloying layer 260 is left unconsumed. In one embodiment this is achieved by deposition of the alloying layer 260 on top of the native oxide of the metal layer 230.

Figure 11:
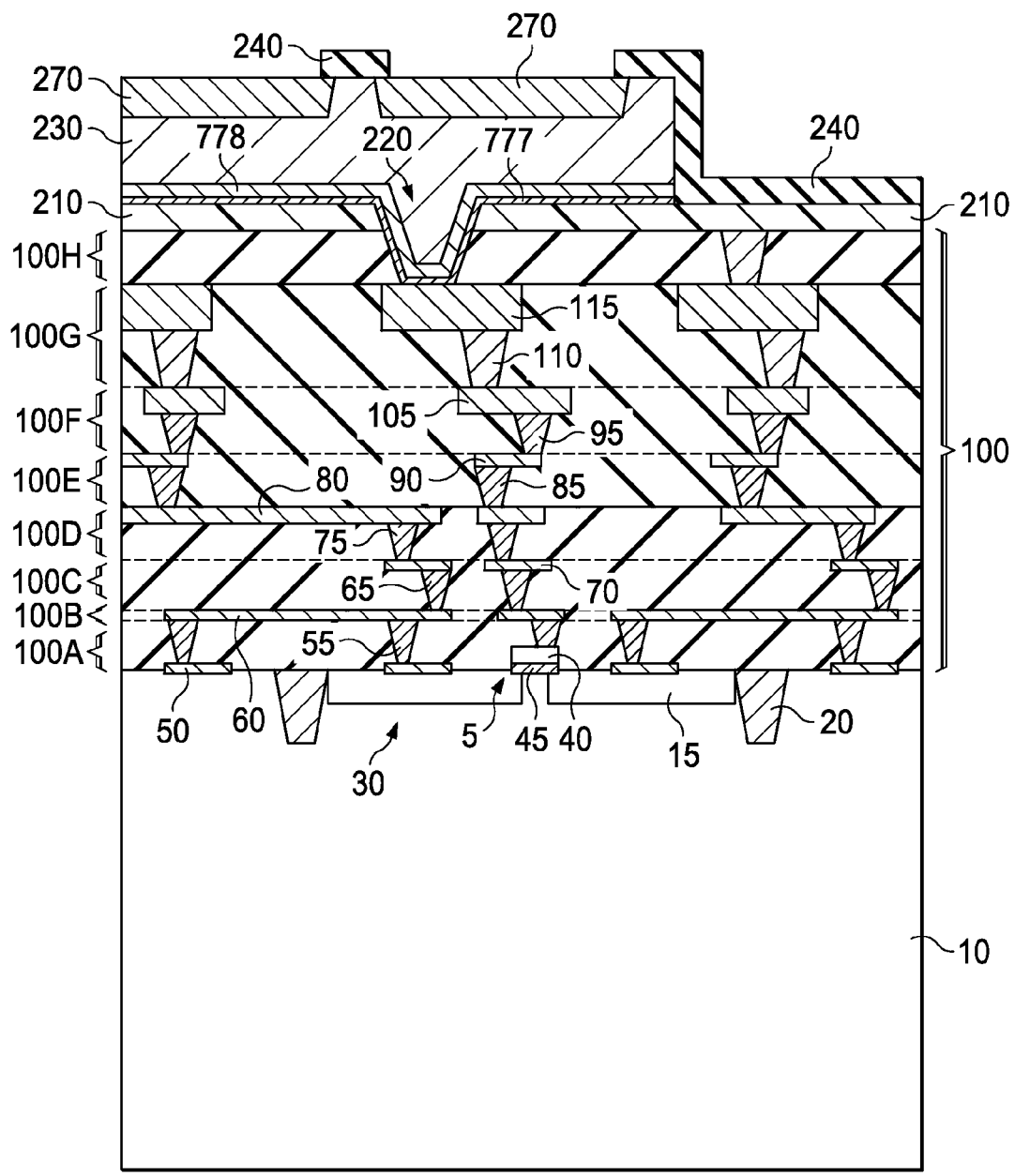

Referring to FIG. 11, any remaining alloying layer 260 is removed. In one embodiment, the remaining alloying layer 260 is removed selectively, i.e., without removing the protective conductive layer 270. For example, in one embodiment, when the alloying layer 260 comprises pure aluminum and the protective conductive layer 270 comprises aluminum bronze, a wet etchant such as a mixture of dimethylsulfoxide, tetramethylammoniumhydroxide, hydroxylamine (DTH) may be used. Advantageously, DTH is very selective and etches the aluminum layer without etching the aluminum-copper alloy layer. In various embodiments, the remaining alloying layer 260 is removed using etchants such as dilute HF, standard clean-1 or SC1 combined with hydrochloric acid. SC1 is $NH_4OH$ (28%), $H_2O_2$ (30%) and dionized water in the ratio of about 1:1:5. In one embodiment, a wet etchant formed from mixing phosphoric acid, nitric acid, acetic acid, and water in the ratio of about 16:1:1:2 may be used. In another embodiment, remaining alloying layer 260 is removed using phosphoric acid based etchants.

In one embodiment, the wet chemical removal of the remaining alloying layer 260 is accomplished by a non-selective etch, which partially removes the protective conductive layer 270 as well.

In one embodiment, the removal of the remaining alloying layer 260 is accomplished by a selective reactive ion etch.

In one embodiment the removal is done by a combination of selective and non-selective etch processes.

In one embodiment an additional lithography step is used covering the protective conduction layer 270 during the removal of remaining alloying layer 260.

In one embodiment an additional lithography step is used covering the protective conduction layer 270 and the remaining alloying layer 260 on top of the protective conduction layer 270 during the removal of the remaining alloying layer 260 on the dielectric passivation layer 240 or second resist layer 550.

Thus, as illustrated in FIG. 11, the protective conductive layer 270 is formed within recesses within the top metal lines 230.

Figure 12:
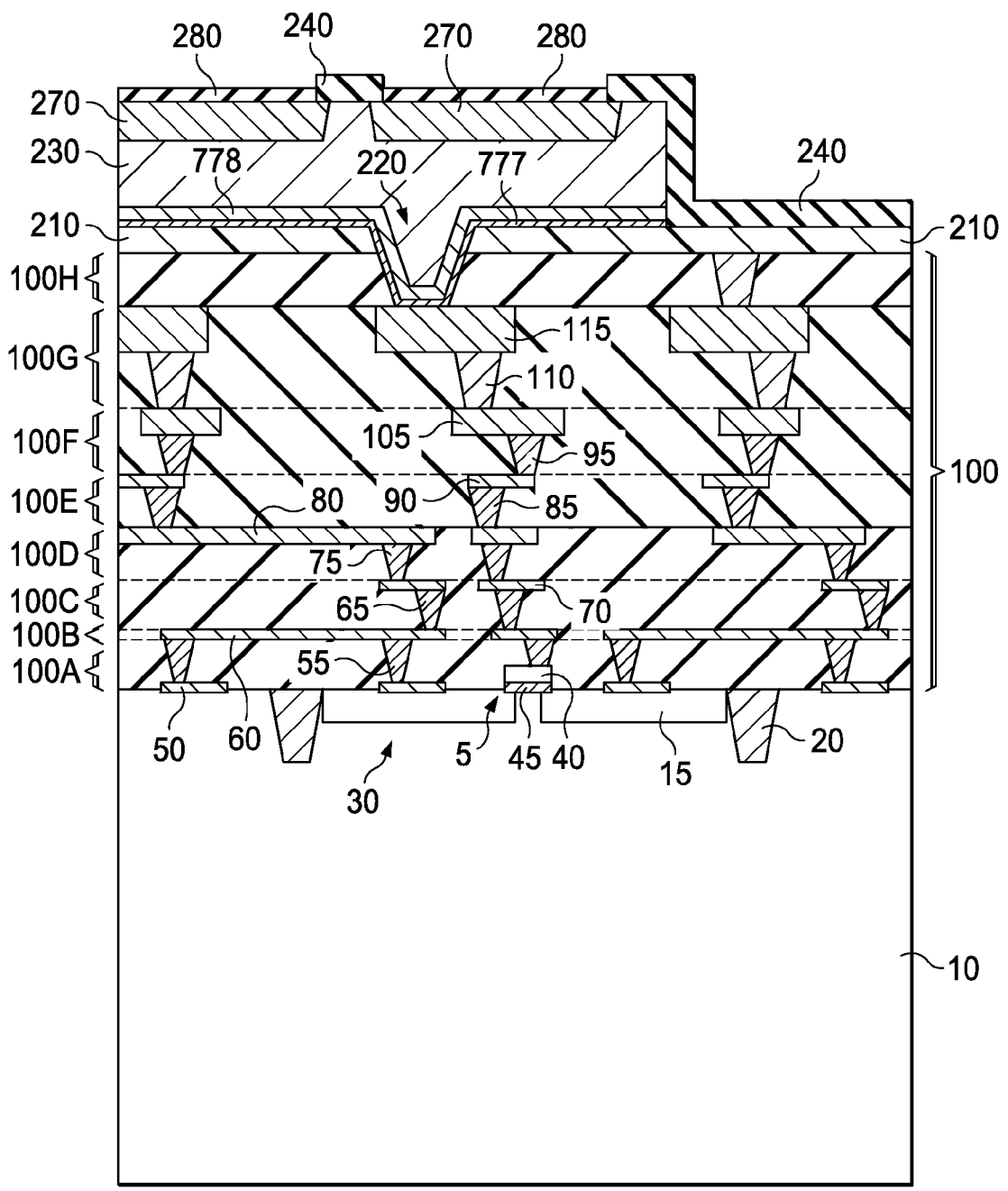

Next as illustrated in FIG. 12, an additional anneal may be performed. However, in various embodiments, the additional anneal is optional. The additional anneal may be performed in an oxidizing atmosphere so as to form a coating 280 comprising an oxide over the protective conductive layer 270. When the protective conductive layer 270 comprises aluminum bronze, a layer of alumina is formed. In some embodiments, the anneal may be performed in a nitridizing (e.g., $NH_3$) atmosphere or a carburizing atmosphere to form a coating 280 comprising a nitride or a carbide. In various embodiments, the coating 280 may be formed without an additional anneal. For example, exposing the protective conductive layer 270 to atmosphere may form a coating 280. For example, a 10 Angstrom to about 50 Angstrom layer of aluminum oxide may form rapidly, for example, in less than a micro-second when the aluminum bronze surface is exposed to an oxygen atmosphere. Advantageously, the coating 280 is impermeable to further oxygen diffusion and therefore stops further oxidation of the protective conductive layer 270. Thus, further processing can continue without danger of corrosion of the top metal lines 230.

Referring to FIG. 13, subsequent processing continues as necessary and may include contact formation. For example, bond wires 295 with or without a solder contact 290 may be formed over the top metal lines 230 by coupling with the protective conductive layer 270. In some embodiments, the coating 280 may be removed prior to the formation of the contacts to minimize contact resistance and improve adhesion. The coating 280 may be removed using a wet etch in one embodiment. In some embodiments, the coating 280 may be have good electrical conductivity and may also promote adhesion of subsequent contact layers. In such embodiments, the coating 280 may not be removed.

In various embodiments, copper, gold, palladium coated copper wires may be bonded to the top metal lines 230 through the protective conductive layer 270. In various embodiments, when the protective conductive layer 270 comprises aluminum bronze, gold wires (for example, having a diameter of about 25 μm) may be bonded to the protective conductive layer 270. Similarly, palladium coated copper wires may be attached to the protective conductive layer 270 comprising aluminum bronze. In various embodiments, the solder contact 290 comprises a layer stack comprising a nickel layer, a palladium layer and a gold layer such that the nickel layer contacts the protective conductive layer 270. Here, the gold layer is the uppermost layer and the nickel layer is the lower most layer of the solder contact 290. In some embodiments, the solder contact 290 comprises a layer stack comprising a nickel layer, a molybdenum layer, a palladium layer and a gold layer such that the nickel layer contacts the protective conductive layer 270. In other embodiments, the solder contact 290 comprises a nickel-phosphor layer, a palladium layer and a gold layer. In other embodiments the gold layer is omitted.

In various embodiments, the protective conductive layer 270 and the coating 280, the solder contact 290, and bond wires 295 may be fabricated in a different facility. However, because of the protective conductive layer 270 and the coating 280 covering the top metal lines 230, the top metal lines 230 do not undergo corrosion. Thus, the back end processing such as die separation, back grinding, die-attach and wire bonding processes may be carried out in facilities with less stricter environments and therefore cheaper facilities without the danger of corroding the top metal lines 230.

Figure 14:
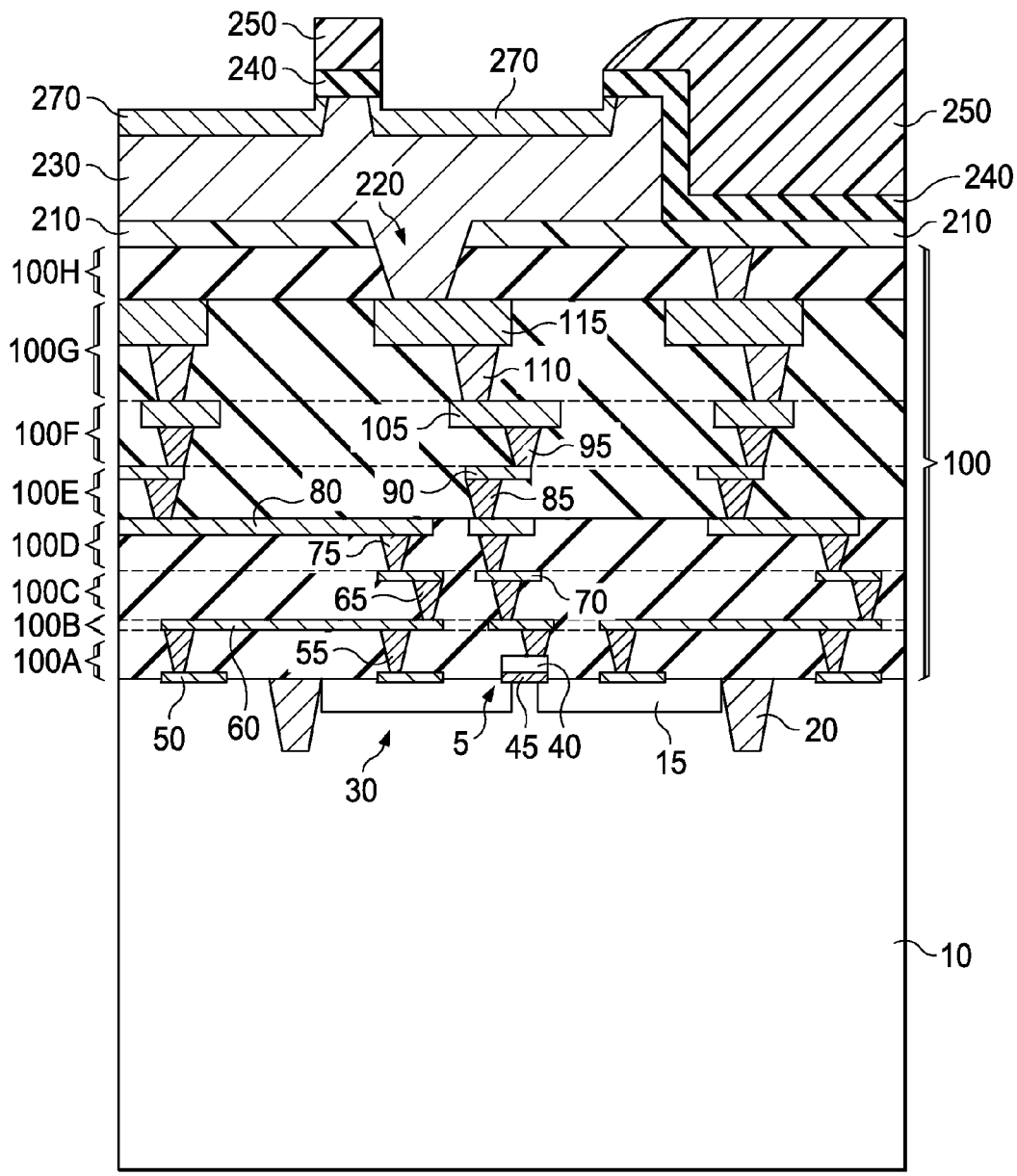
FIGS. 14-15 illustrate an alternative embodiment of the invention using a partially selective etch to form a semiconductor device having top metal lines covered with a protective conductive layer.
Figure 15:
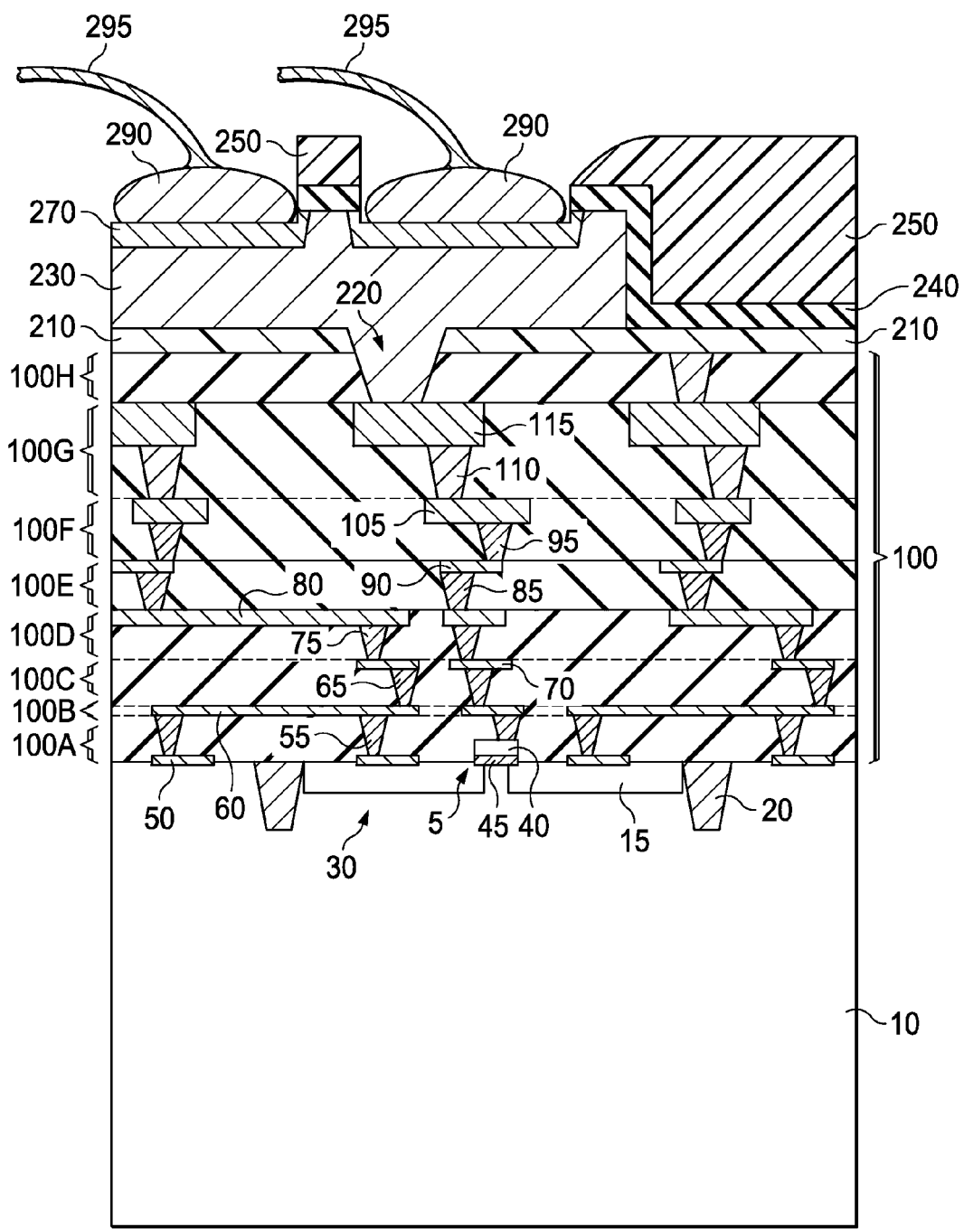

FIGS. 14-15 illustrate an alternative embodiment of the invention of forming a semiconductor device having top metal lines covered with a protective conductive layer.

The embodiment of FIG. 14 proceeds as in the prior embodiment as described in FIGS. 2-9. However, unlike the embodiment of FIG. 11, a non-selective or a partially selective etch is used to remove the remaining alloying layer 260. Examples of etchants that are partially selective or non-selective between the alloying layer 260 and the protective conductive layer 270 include buffered hydrofluoric acid, ammonium hydroxide. Thus, a portion of the protective conductive layer 270 is etched. The top surface of the protective conductive layer 270 is lower than the top surface of the top metal lines 230 as illustrated in FIG. 14 and FIG. 15. Also, FIGS. 14 and 15 show an embodiment where the second resist mask comprising of cured photo imide has not been removed.

Because the thickness of the protective conductive layer 270 is more than the as-deposited alloying layer 260, a substantial portion of the protective conductive layer 270 remains after all of the as-deposited alloying layer 260 is removed. In one embodiment, a timed etch may be used while in another embodiment, a suitable end point detection scheme may be used and the etching process is stopped after all of the alloying layer 260 has been etched.

Subsequent processing proceeds as described in prior embodiment, for example, in FIGS. 12-13. The semiconductor device after further processing in the same or different manufacturing facility is illustrated in FIG. 15. As one example, bond wires 295 couple to the contact pads on the top metal lines 230 through the sold contacts 290 and the protective conductive layer 270.

Figure 16:
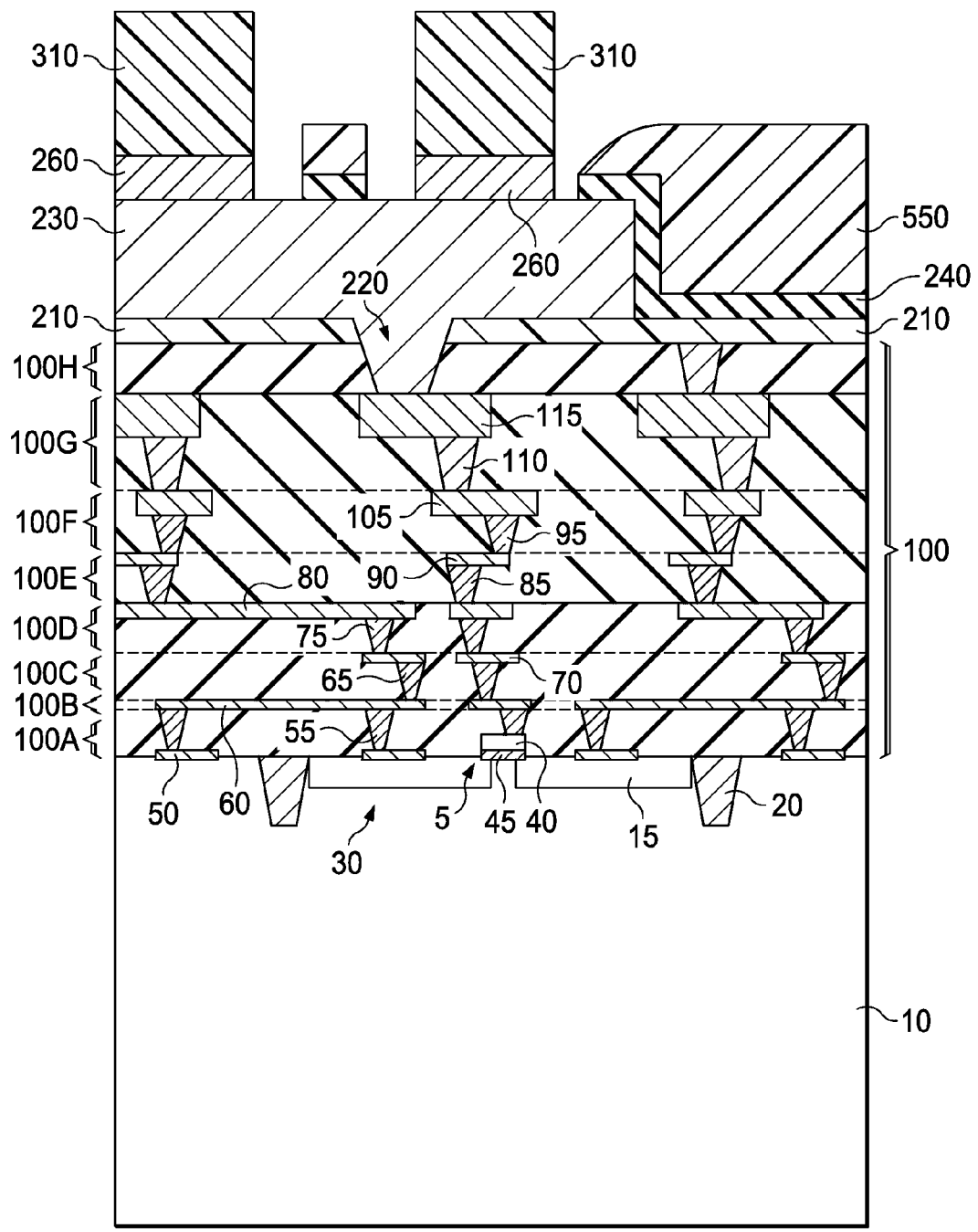
FIGS. 16-17 illustrate another embodiment of the present invention using an additional patterning step to form a semiconductor device having top metal lines covered with a protective conductive layer.
Figure 17:
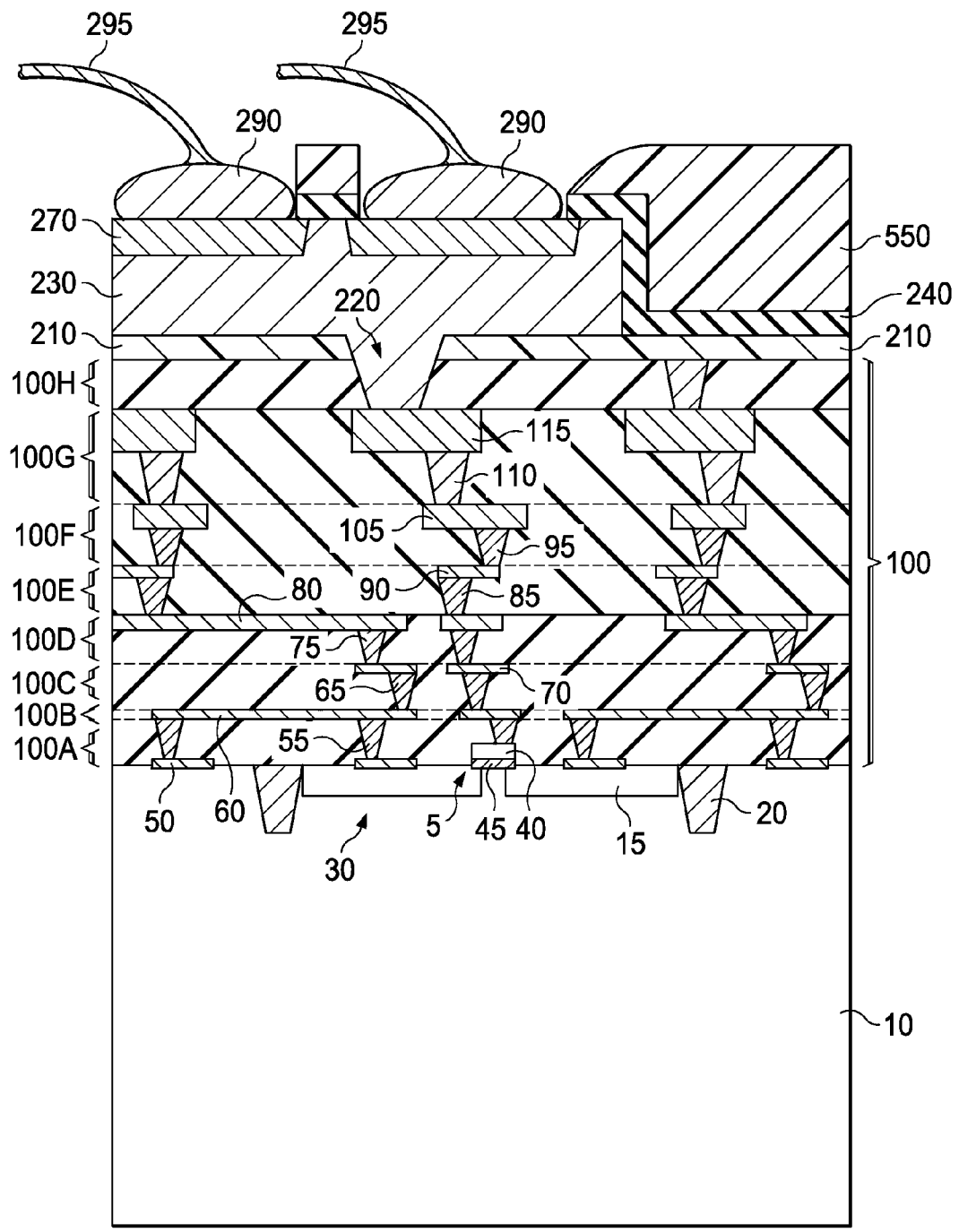

FIGS. 16-17 illustrate another embodiment of the present invention using an additional patterning step to form a semiconductor device having top metal lines covered with a protective conductive layer.

This embodiment is similar to the embodiment described previously but includes an additional patterning step. In the prior embodiment, as described previously in FIGS. 3-9, a conformal alloying layer 260 is deposited. In this embodiment, after forming a conformal layer, the alloying layer 260 is patterned using an additional lithography step. Therefore, this embodiment follows the embodiment from FIGS. 3-9.

Next, as illustrated in FIG. 16, a third resist layer 310 is deposited over the alloying layer 260. The third resist layer 310 is patterned so that the alloying layer 260 is removed from over the second resist layer 250. Similarly, the patterning of the third resist layer 310 may be used to avoid the alloying layer 260 from the sidewalls of the top metal lines 230.

As illustrated in FIG. 16, the pattern from the patterned third resist layer 310 is transferred to underlying alloying layer 260 thereby forming a patterned alloying layer 260. As next illustrated in FIG. 17, subsequent process steps may follow as described previously with respect to FIGS. 10-13 and/or FIGS. 14-15 to finalize the formation of a protective conductive layer 270, and optionally a solder contact 290 and optional bond wires 295.

Figure 18:
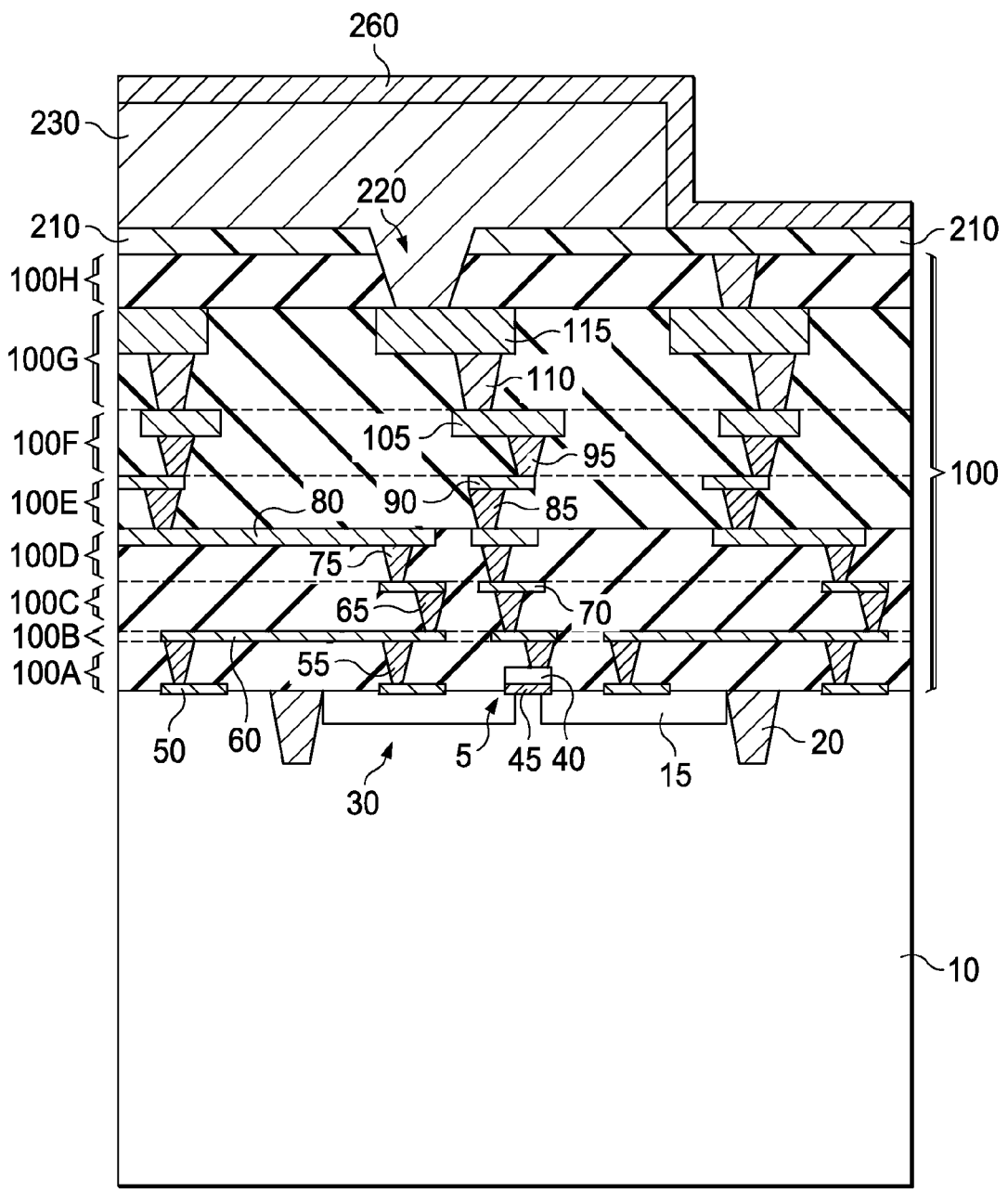
FIG. 18-20 illustrate another embodiment of the present invention of forming a semiconductor device having top metal lines covered with a protective conductive layer, wherein the protective conductive layer covers both a top surface and sidewalls of the top metal lines.
Figure 19:
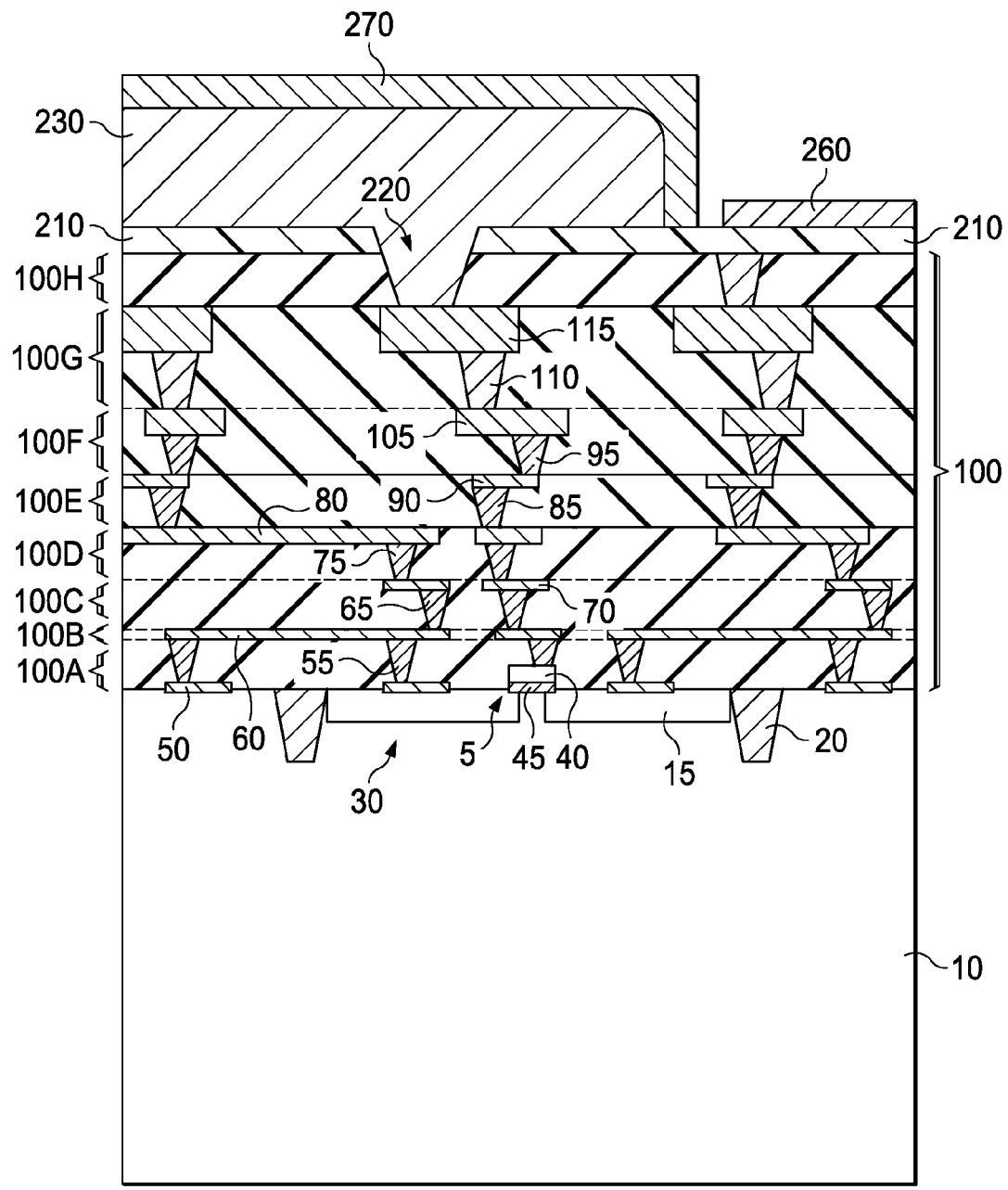
Figure 20:
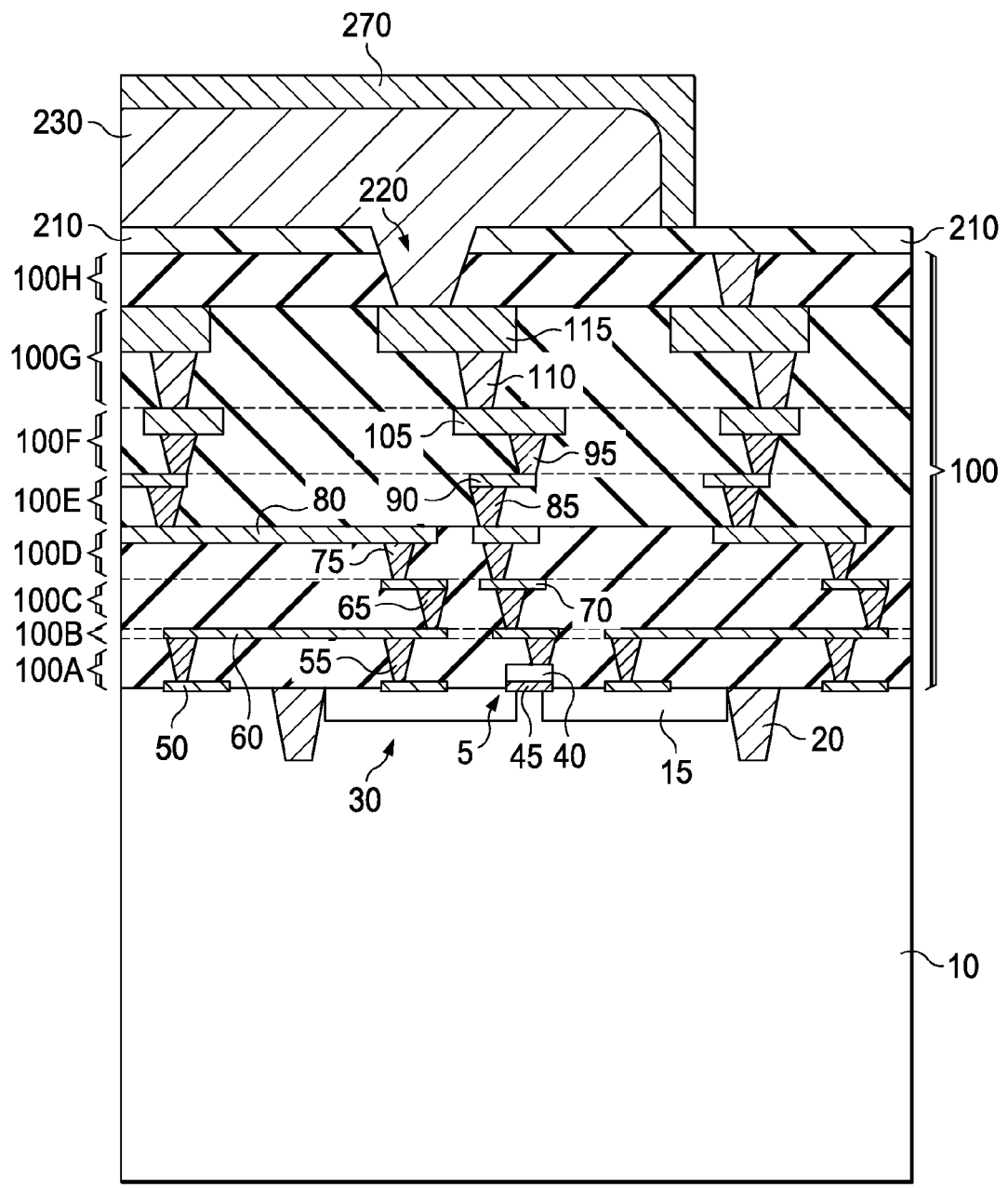

FIG. 18-20 illustrate another embodiment of the present invention of forming a semiconductor device having top metal lines covered with a protective conductive layer, wherein the protective conductive layer covers both a top surface and sidewalls of the top metal lines.

Figure 4:
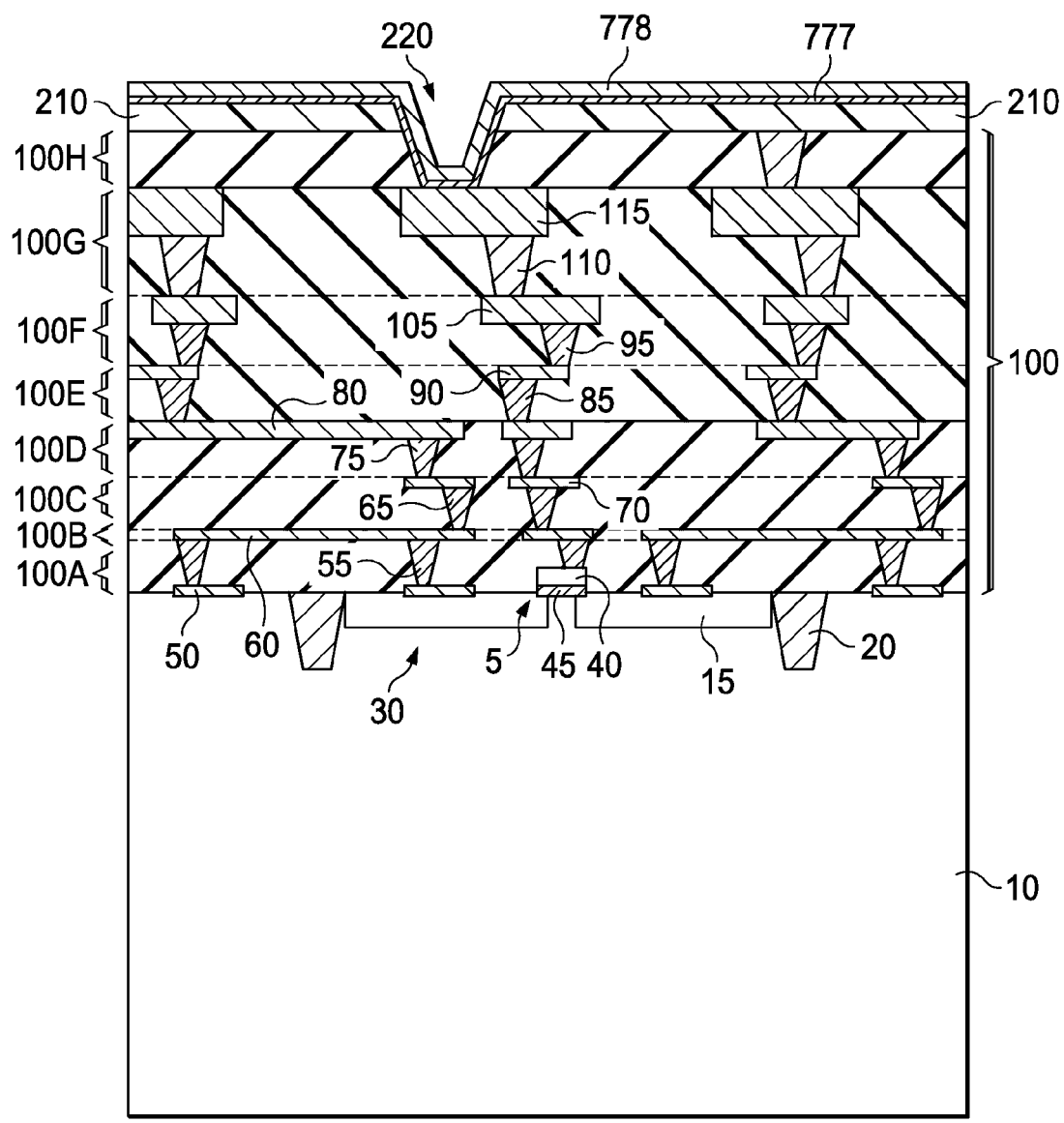

This embodiment proceeds similar to the prior embodiments, for example, as described with respect to FIGS. 3-5. However, unlike the prior embodiments, prior to the deposition of a second resist layer 250, an alloying layer 260 is deposited over the top metal lines 230. Thus, in this embodiment, both the top surface as well as the sidewalls of the top metal lines 230 may be protected.

Referring to FIG. 18, the alloying layer 260 conformally covers the top metal lines 230. The alloying layer 260 may be sputter deposited in one embodiment, although any suitable deposition process may be used in various embodiments. In various embodiments, the alloying layer 260 having a thickness of about 5 nm to about 50 nm, and about 10 nm to about 20 nm is deposited. In various embodiments, the alloying layer 260 comprises a pure metal comprising aluminum, nickel, or tin. In one embodiment, the alloying layer 260 comprises aluminum or aluminum doped to less than about 1% with copper.

The alloying layer 260 is annealed as described previously, for example, with respect to FIG. 10. After the annealing, a protective conductive layer 270 is formed over the top metal lines 230 as described previously. Some alloying layer 260 may remain unreacted.

As next illustrated in FIG. 19, the remaining alloying layer 260 may be removed either selectively as described with respect to FIG. 11 or non-selectively as described with respect to FIGS. 14-15. Further processing continues as described in prior embodiments.

Advantageously, in this embodiment, the protective conductive layer 270 protects the underlying copper in the top metal lines 230 from environmental degradation arising laterally through the sidewalls as well as arising vertically from the top surface of the top metal lines 230. Also, in this embodiment the grain structure of the underlying copper lines is fixed in such a way that the line experiences an enhancement in thermo-mechanical robustness during device operation.

Figure 21:
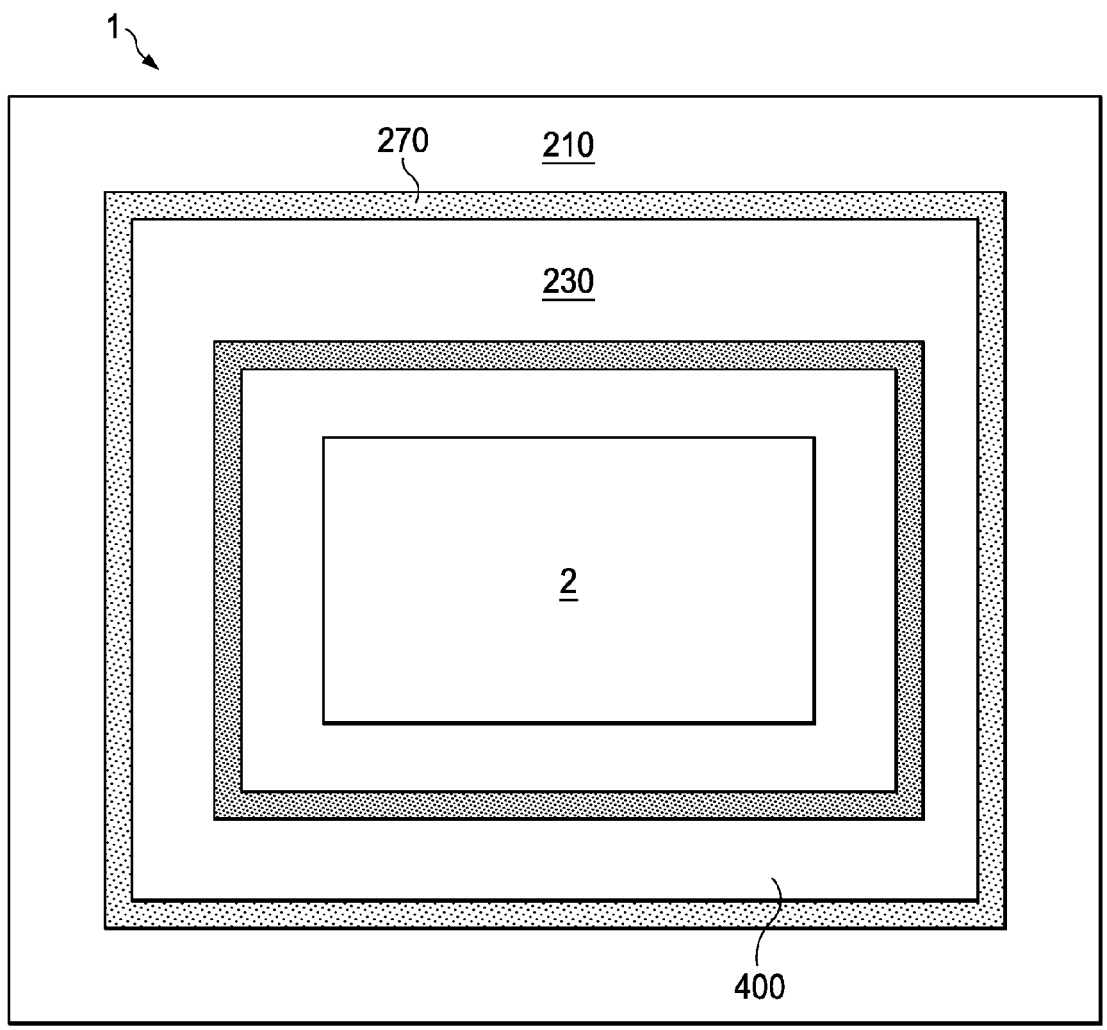
FIG. 21 illustrates a semiconductor device in which the uppermost metal lines of the moisture barrier or crack stop layer are covered with a protective layer in accordance with embodiments of the invention.

FIG. 21 illustrates a semiconductor device in which the uppermost metal lines of the moisture barrier or crack stop layer are covered with a protective layer in accordance with embodiments of the invention.

In various embodiments, the protective layer may also cover additional structures beyond the device regions. For example, as illustrated in FIG. 21, the protective conductive layer 270 is formed on the uppermost metal line of the moisture barrier 400. The moisture barrier 400 may be formed around the device regions 2 of the chip 1. The moisture barrier 400 may have any suitable structure and comprises a vertical wall of conductive material comprising metal lines and vias (e.g., as shown in FIG. 1B) in one embodiment. The moisture barrier 400 protects the device regions 2 from moisture. The protective conductive layer 270 enhances this protective behavior of the moisture barrier 400 by inhibiting entry of moisture and other oxidants through the uppermost metallization.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   forming a metal line over a substrate;
   depositing an alloying material layer over a top surface of the metal line and sidewalls of the metal line;
   forming an alloy layer by converting a portion of the metal line by alloying the metal line with the alloying material layer;
   converting an exposed surface of the alloy layer to form a protective layer;
   etching the protective layer to expose the alloy layer; and
   forming a solder layer on the exposed alloy layer.

2. The method of claim 1, wherein the metal line comprises copper, wherein the alloying material layer comprises aluminum, wherein the alloy layer comprises aluminum bronze, and wherein the protective layer comprises alumina.

3. The method claim 2, further comprising removing remaining alloying material layer selectively without removing the alloy layer.

4. The method of claim 1, further comprising removing remaining alloying material layer and removing at least a portion of the alloy layer after forming the alloy layer.

5. The method of claim 1, further comprising:
   depositing a passivation layer after depositing the alloying material layer; and
   removing remaining alloying material layer after forming the alloy layer.

6. The method of claim 1, wherein forming the alloy layer comprises annealing at about 350° C. to about 400° C.

7. The method of claim 1, wherein converting the exposed surface of the alloy layer to form the protective layer comprises oxidizing the exposed surface of the alloy layer.

8. The method of claim 1, wherein converting the exposed surface of the alloy layer to form the protective layer comprises nitridizing or carburizing the exposed surface of the alloy layer.

9. The method of claim 1, wherein the alloying material layer comprises a material selected from a group consisting of nickel, magnesium, tin, chromium, and zinc, and wherein the alloy layer comprises copper and the material selected from the group.

10. The method of claim 1, wherein forming the solder layer comprises:
    forming a layer stack comprising a nickel layer, a molybdenum layer, a palladium layer and a gold layer.

11. The method of claim 10, wherein the nickel layer contacts the exposed alloy layer.

12. The method of claim 1, wherein the solder layer comprises a top surface configured to be wire bonded.

13. The method of claim 1, wherein the alloying material layer is further deposited over a top surface of a metal line and sidewalls of the metal line of a moisture barrier, and wherein the alloy layer is further formed by converting a portion of the metal line of the moisture barrier by alloying the metal line of the moisture barrier with the alloying material layer.

14. The method of claim 1, wherein the alloying material layer is further deposited over a top surface of a metal line and sidewalls of the metal line of a crack stop layer, and wherein the alloy layer is further formed by converting a portion of the metal line of the crack stop layer by alloying the metal line of the crack stop layer with the alloying material layer.

15. A method of forming a semiconductor device, the method comprising:
    forming a metal line over a substrate;
    depositing an alloying material layer over a top surface of the metal line;

forming an alloy layer by converting a portion of the metal line by alloying the metal line with the alloying material layer;

converting an exposed surface of the alloy layer to form a protective layer;

etching the protective layer to expose the alloy layer; and forming a solder layer on the exposed alloy layer.

16. The method of claim 15, further comprising:

before depositing an alloying material layer, depositing a passivation layer over the metal line, the passivation layer disposed over sidewalls of the metal line; and opening a portion of the passivation layer to expose the top surface of the metal line.

17. The method of claim 16, further comprising patterning the alloying material layer before forming the alloy layer.

18. The method of claim 17, wherein the patterning of the alloying material layer comprises removing the alloying material layer from sidewalls of the passivation layer.

19. The method of claim 15, further comprising:

wherein depositing the alloying material layer comprises depositing the alloying material layer over sidewalls of the metal line.

20. The method of claim 15, wherein the metal line comprises copper, wherein the alloying material layer comprises aluminum, wherein the alloy layer comprises aluminum bronze, and wherein the protective layer comprises alumina.

21. The method claim 20, further comprising removing remaining alloying material layer selectively without removing the alloy layer.

22. The method of claim 15, further comprising removing remaining alloying material layer and removing at least a portion of the alloy layer after forming the alloy layer.

23. The method of claim 15, wherein forming the alloy layer comprises annealing at about 350° C. to about 400° C.

24. The method of claim 15, wherein converting the exposed surface of the alloy layer to form the protective layer comprises oxidizing the exposed surface of the alloy layer.

25. The method of claim 15, wherein converting the exposed surface of the alloy layer to form the protective layer comprises nitridizing or carburizing the exposed surface of the alloy layer.

26. The method of claim 15, wherein the alloying material layer comprises a material selected from a group consisting of nickel, magnesium, tin, chromium, and zinc, and wherein the alloy layer comprises copper and the material selected from the group.

27. The method of claim 15, wherein forming the solder layer comprises:

forming a layer stack comprising a nickel layer, a molybdenum layer, a palladium layer and a gold layer, wherein the nickel layer contacts the exposed alloy layer.

28. The method of claim 15, wherein the solder layer comprises a top surface configured to be wire bonded.

29. The method of claim 15, wherein the alloying material layer is further deposited over a top surface of a metal line and sidewalls of the metal line of a moisture barrier, and wherein the alloy layer is further formed by converting a portion of the metal line of the moisture barrier by alloying the metal line of the moisture barrier with the alloying material layer.

30. The method of claim 15, wherein the alloying material layer is further deposited over a top surface of a metal line and sidewalls of the metal line of a crack stop layer, and wherein the alloy layer is further formed by converting a portion of the metal line of the crack stop layer by alloying the metal line of the crack stop layer with the alloying material layer.

31. A method of forming a semiconductor device, the method comprising:

forming a metal line over a substrate;

forming a passivation layer over a top surface and sidewalls of the metal line;

opening a portion of the passivation layer to expose the top surface of the metal line, the passivation layer remaining over at least a portion of the top surface of the metal line and over at least a portion of the sidewalls of the metal line;

forming an alloying material layer over the top surface of the metal line;

forming an alloy layer by converting a portion of the metal line by alloying the metal line with the alloying material layer;

forming a protective layer by converting an exposed surface of the alloy layer;

removing the protective layer to expose the alloy layer; and forming a solder layer on the exposed alloy layer.

32. The method of claim 31, further comprising patterning the alloying material layer before forming the alloy layer.

33. The method of claim 32, wherein the patterning of the alloying material layer comprises removing the alloying material layer from sidewalls of the passivation layer.

34. A method of forming a semiconductor device, the method comprising:

forming a dielectric layer over a substrate;

forming a metal line over the dielectric layer;

forming an alloying material layer over a top surface of the metal line and sidewalls of the metal line and over an exposed top surface of the dielectric layer;

forming an alloy layer by converting a portion of the metal line by alloying the metal line with the alloying material layer;

removing remaining alloying material layer from over the dielectric layer after forming the alloy layer;

converting an exposed surface of the alloy layer to form a protective layer;

removing the protective layer to expose the alloy layer; and forming a solder layer on the exposed alloy layer.

* * * * *